United States Patent
Subramanian et al.

(10) Patent No.: US 11,329,138 B2
(45) Date of Patent: May 10, 2022

(54) SELF-ALIGNED GATE ENDCAP (SAGE) ARCHITECTURE HAVING ENDCAP PLUGS

(71) Applicant: Intel Corporation, Santa Clara, CA (US)

(72) Inventors: Sairam Subramanian, Portland, OR (US); Christopher Kenyon, Portland, OR (US); Sridhar Govindaraju, Portland, OR (US); Chia-Hong Jan, Portland, OR (US); Mark Liu, West Linn, OR (US); Szuya S. Liao, Portland, OR (US); Walid M. Hafez, Portland, OR (US)

(73) Assignee: Intel Corporation, Santa Clara, CA (US)

(*) Notice: Subject to any disclaimer, the term of this patent is extended or adjusted under 35 U.S.C. 154(b) by 829 days.

(21) Appl. No.: 15/943,552

(22) Filed: Apr. 2, 2018

(65) Prior Publication Data
US 2019/0305111 A1  Oct. 3, 2019

(51) Int. Cl.
*H01L 29/66* (2006.01)
*H01L 21/762* (2006.01)
(Continued)

(52) U.S. Cl.
CPC ...... *H01L 29/66545* (2013.01); *H01L 21/762* (2013.01); *H01L 21/76895* (2013.01);
(Continued)

(58) Field of Classification Search
CPC ............. H01L 21/762; H01L 21/76895; H01L 21/823431; H01L 21/823481;
(Continued)

(56) References Cited

U.S. PATENT DOCUMENTS 9,911,736 B1    3/2018  Zang et al.
2015/0270222 A1*  9/2015  Alptekin ............... H01L 29/665
                                                    257/288
(Continued)

FOREIGN PATENT DOCUMENTS

WO    WO 2018/004680    1/2018

OTHER PUBLICATIONS

Search Report for European Patent Application No. 19160416.4, dated Jul. 26, 2019, 8 pgs.
(Continued)

*Primary Examiner* — Allan R Wilson
(74) *Attorney, Agent, or Firm* — Schwabe, Williamson & Wyatt, P.C.

(57) ABSTRACT

Self-aligned gate endcap (SAGE) architectures having gate endcap plugs or contact endcap plugs, or both gate endcap plugs and contact endcap plugs, and methods of fabricating SAGE architectures having such endcap plugs, are described. In an example, a first gate structure is over a first of a plurality of semiconductor fins. A second gate structure is over a second of the plurality of semiconductor fins. A first gate endcap isolation structure is laterally between and in contact with the first gate structure and the second gate structure and has an uppermost surface co-planar with an uppermost surface of the first gate structure and the second gate structure. A second gate endcap isolation structure is laterally between and in contact with first and second lateral portions of the first gate structure and has an uppermost surface below an uppermost surface of the first gate structure.

20 Claims, 18 Drawing Sheets

(51) Int. Cl.
*H01L 21/768* (2006.01)
*H01L 21/8238* (2006.01)
*H01L 27/092* (2006.01)
*H01L 29/06* (2006.01)
*H01L 21/8234* (2006.01)
*H01L 27/088* (2006.01)

(52) U.S. Cl.
CPC ......... *H01L 21/823431* (2013.01); *H01L 21/823481* (2013.01); *H01L 21/823821* (2013.01); *H01L 27/0886* (2013.01); *H01L 27/0924* (2013.01); *H01L 29/0649* (2013.01); *H01L 21/823437* (2013.01)

(58) Field of Classification Search
CPC ......... H01L 21/823821; H01L 27/0886; H01L 27/0924; H01L 29/0649; H01L 29/41791; H01L 29/42356; H01L 29/66545
See application file for complete search history.

(56) References Cited

U.S. PATENT DOCUMENTS

2016/0336234 A1* 11/2016 Kim ................ H01L 21/823431
2016/0380052 A1* 12/2016 Kim ................ H01L 27/1211
257/401

OTHER PUBLICATIONS

Office Action for European Patent Application No. 19160416.4, dated Jun. 23, 2021, 7 pgs.

* cited by examiner

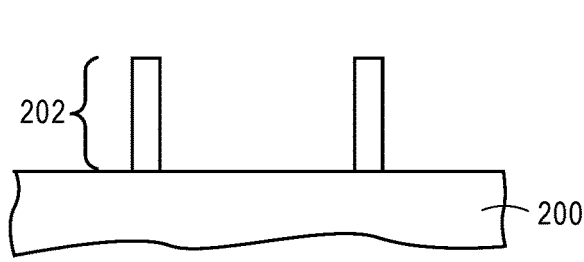
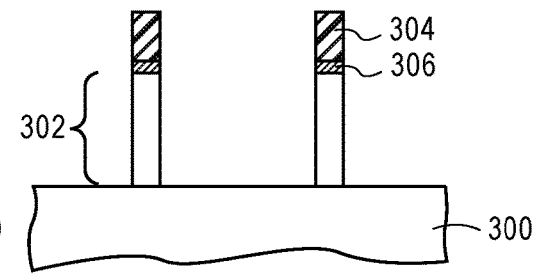
FIG. 2A
PRIOR ART
FIG. 3A
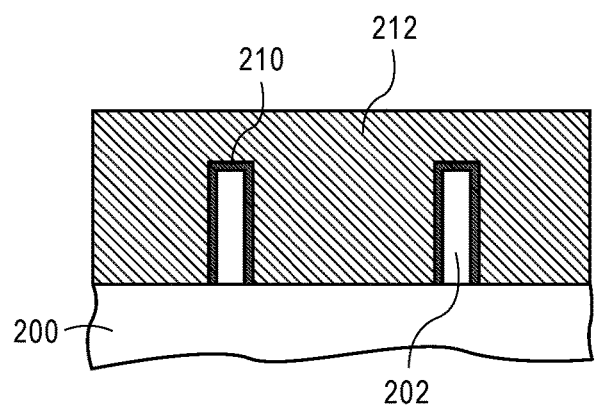
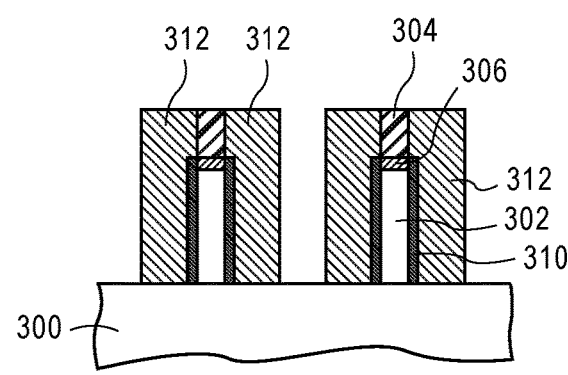
FIG. 2B
PRIOR ART
FIG. 3B

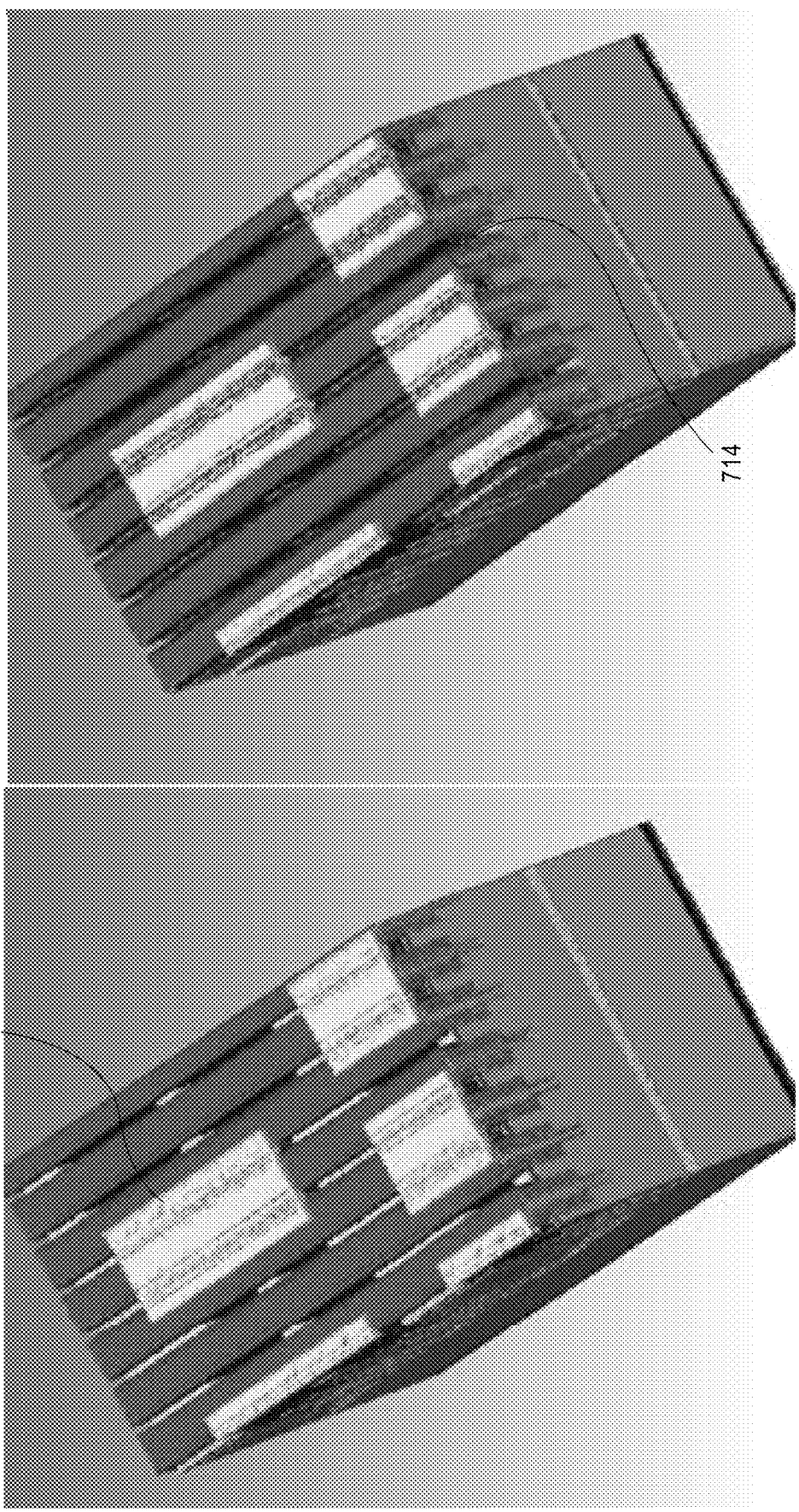

SELF-ALIGNED GATE ENDCAP (SAGE) ARCHITECTURE HAVING ENDCAP PLUGS

TECHNICAL FIELD

Embodiments of the disclosure are in the field of integrated circuit structures and processing and, in particular, self-aligned gate endcap (SAGE) architectures having gate endcap plugs or contact endcap plugs, or both gate endcap plugs and contact endcap plugs, and methods of fabricating SAGE architectures having such endcap plugs.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process.

Scaling multi-gate transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features. Additionally, the constraints on including passive features among active devices have increased.

BRIEF DESCRIPTION OF THE DRAWINGS

FIGS. 2A-2D illustrate cross-sectional views of process operations of significance in a conventional finFET or tri-gate process fabrication scheme.

FIGS. 3A-3D illustrate cross-sectional views of process operations of significance in a self-aligned gate endcap (SAGE) process fabrication scheme for finFET or tri-gate devices, in accordance with an embodiment of the present disclosure.

FIGS. 7A-7E illustrates top-down angled double cross-sectional views of various operations in a method of fabricating an integrated circuit structure having gate endcap plugs, in accordance with an embodiment of the present disclosure.

DESCRIPTION OF THE EMBODIMENTS

Figure 1:
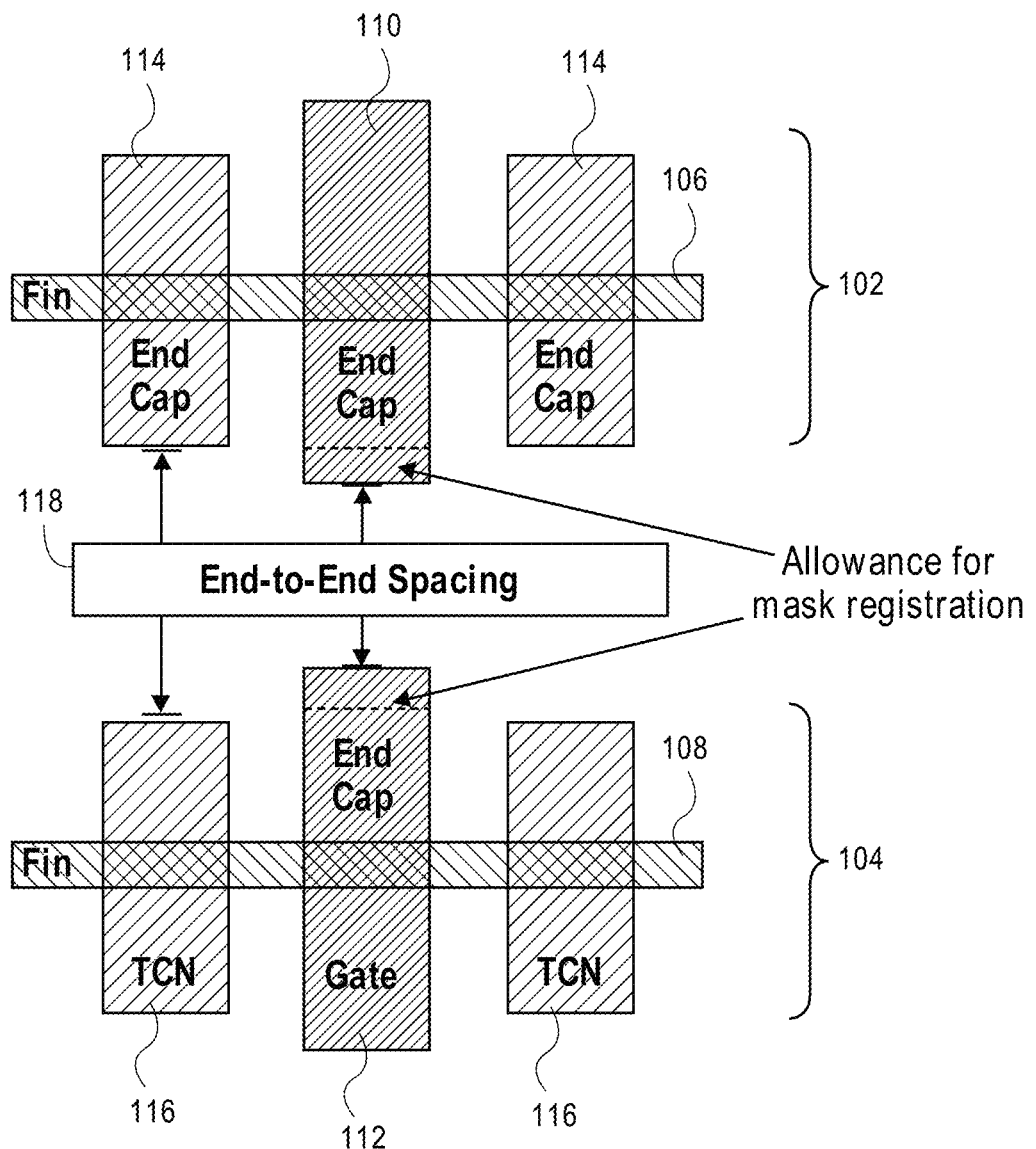
FIG. 1 illustrates a plan view of a layout including fin-based integrated circuit structures accommodating end-to-end spacing.

Self-aligned gate endcap (SAGE) architectures having gate endcap plugs or contact endcap plugs, or both gate endcap plugs and contact endcap plugs, and methods of fabricating SAGE architectures having such endcap plugs, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments of the present disclosure are directed to integrated circuit structures or devices having one or more gate endcap structures (e.g., as gate isolation regions) of gate electrodes of the integrated circuit structures or devices. The gate endcap structures may be self-aligned gate endcap (SAGE) walls formed between and in parallel alignment with a plurality of semiconductor fins. In an embodiment, a SAGE wall is not reduced in height in certain locations in order to retain a gate endcap plug portion or a contact endcap plug portion. The SAGE walls is reduced in height in certain other locations to allow for gate or contact continuity over the SAGE wall. In a particular embodiment, a SAGE wall is first formed at an initial height and represents dielectric plug formation at all gate and contact locations. Portions of the SAGE wall are then reduced in height, effectively removing dielectric plugs in select locations. In one or more embodiments, self-aligned gate endcap structures are fabricated for logic transistors based on complementary metal oxide semiconductor (CMOS) devices.

To provide context, logic devices continue to be aggressively scaled in dimension, creating fabrication and yield challenges for gate and contact endcap patterning. One or more embodiments disclosed herein address the problem of scaling gate and contact end-to-end spacing in an ultra-scaled process technology. In one embodiment, a self-aligned perpendicular grid of an insulating material that runs perpendicular to gates/contacts is formed, e.g., as a SAGE wall. The intersection of the grid with gates/contacts provides all possible locations of dielectric endcap plugs. Inverted patterning schemes are then used to trim or recess the plugs that are not needed as per the design, allowing the contact or gate metal to be formed over locations of the SAGE wall that have been recessed to remove the dielectric plug effect of the SAGE wall in those locations.

To provide further context, patterning limitations of the state-of-the-art processing scheme include one or both of (1) tall gate height may result in unfavorable aspect ratios for etches and fills and resultant increased capacitance, (2) metal in plug defects may short two nodes through an endcap. In an embodiment, a processing scheme begins with fabrication of a self-aligned insulating plug at all possible locations before the formation of gates and contacts, followed by trim or recess of the plugs that are not desired. It is to be appreciated that in a state-of-the art SAGE scheme, placeholders are used for potential plug locations, however, plugs are formed after the gate and contact definition which results in a potential for metal pipes or fangs across the plugs. Such metal pipes or fangs may cause unwanted shorting.

To provide a foundation for SAGE concepts relevant to embodiments described herein, scaling of gate endcap and trench contact (TCN) endcap regions are important contributors towards improving transistor layout area and density. Gate and TCN endcap regions refer to gate and TCN overlap of the diffusion region/fins of integrated circuit structures. As an example, FIG. 1 illustrates a plan view of a layout 100 including fin-based integrated circuit structures accommodating end-to-end spacing. Referring to FIG. 1, first 102 and second 104 integrated circuit structures are based on semiconductor fins 106 and 108, respectively. Each device 102 and 104 has a gate electrode 110 or 112, respectively. Additionally, each device 102 and 104 has trench contacts (TCNs) 114 and 116, respectively, at source and drain regions of the fins 106 and 108, respectively. The gate electrodes 110 and 112 and the TCNs 114 and 116 each have an end cap region, which is located off of the corresponding fins 106 and 108, respectively.

Referring again to FIG. 1, typically, gate and TCN endcap dimensions must include an allowance for mask registration error to ensure robust transistor operation for worst case mask mis-registration, leaving an end-to-end spacing 118. Thus, another important design rule critical to improving transistor layout density is the spacing between two adjacent endcaps facing each other. However, the parameters of "2*Endcap+End-to-End Spacing" are becoming increasingly difficult to scale using lithographic patterning to meet the scaling requirements for new technologies. In particular, the additional endcap length required to allow for mask registration error also increases gate capacitance values due to longer overlap length between TCN and gate electrodes, thereby increasing product dynamic energy consumption and degrading performance. Previous solutions have focused on improving registration budget and patterning or resolution improvements to enable shrinkage of both endcap dimension and endcap-to-endcap spacing.

In accordance with an embodiment of the present disclosure, approaches are described which provide for self-aligned gate endcap and TCN overlap of a semiconductor fin without any need to allow for mask registration. In one such embodiment, a disposable spacer is fabricated on the semiconductor fin endcaps which determines the gate endcap and the contact overlap dimensions. The spacer defined endcap process enables the gate and TCN endcap regions to be self-aligned to the semiconductor fin and, therefore, does not require extra endcap length to account for mask mis-registration. Furthermore, approaches described herein do not require lithographic patterning at previously required stages since the gate and TCN endcap/overlap dimensions remain fixed, leading to improvement (i.e., reduction) in device to device variability in electrical parameters.

In order to provide a side-by-side comparison, FIGS. 2A-2D illustrate cross-sectional views of process operations of significance in a conventional finFET or tri-gate process fabrication scheme, while FIGS. 3A-3D illustrate cross-sectional views of process operations of significance in a self-aligned gate endcap (SAGE) process fabrication scheme for finFET or tri-gate devices, in accordance with an embodiment of the present disclosure.

Referring to FIGS. 2A and 3A, a bulk semiconductor substrate 200 or 300, such as a bulk single crystalline silicon substrate is provided having fins 202 or 302, respectively, etched therein. In an embodiment, the fins are formed directly in the bulk substrate 200 or 300 and, as such, are formed continuous with the bulk substrate 200 or 300. It is to be appreciated that within the substrate 200 or 300, shallow trench isolation structures may be formed between fins. Referring to FIG. 3A, a hardmask layer 304, such as a silicon nitride hardmask layer, and a pad oxide layer 306, such as a silicon dioxide layer, remain atop fins 302 following patterning to form the fins 302. By contrast, referring to FIG. 2A, such a hardmask layer and pad oxide layer have been removed.

Referring to FIG. 2B, a dummy or permanent gate dielectric layer 210 is formed on the exposed surfaces of the semiconductor fins 202, and a dummy gate layer 212 is formed over the resulting structure. By contrast, referring to FIG. 3B, a dummy or permanent gate dielectric layer 310 is formed on the exposed surfaces of the semiconductor fins 302, and dummy spacers 312 are formed adjacent to the resulting structure.

Figure 2C:
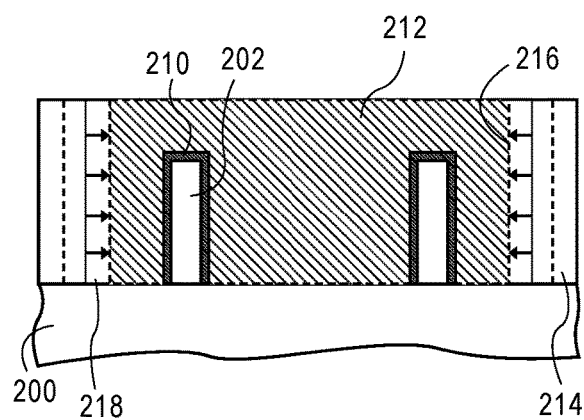

Referring to FIG. 2C, gate endcap cut patterning is performed and isolation regions 214 are formed at the resulting patterned dummy gate ends 216. In the conventional process scheme, a larger gate endcap must be fabricated to allow for gate mask mis-registration, as depicted by the arrowed regions 218. By contrast, referring to FIG. 3C, self-aligned isolation regions 314 are formed by providing an isolation layer over the structure of FIG. 3B, e.g., by deposition and planarization. In one such embodiment, the self-aligned gate endcap process does not require extra space for mask registration, as compared in FIGS. 2C and 3C.

Figure 2D:
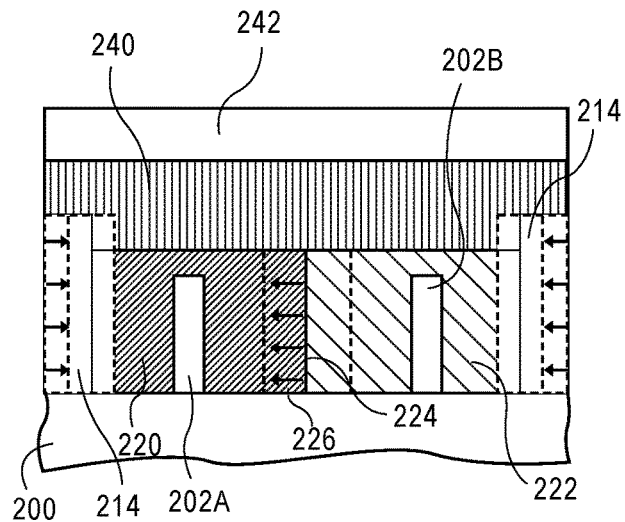

Referring to FIG. 2D, the dummy gate electrode 212 of FIG. 2C is replaced with permanent gate electrodes. In the case of use of a dummy gate dielectric layer, such a dummy gate dielectric layer may also be replaced by a permanent gate dielectric layer in this process. In the specific example shown, a dual metal gate replacement process is performed to provide an N-type gate electrode 220 over a first semiconductor fin 202A and to provide a P-type gate electrode 222 over a second semiconductor fin 202B. The N-type gate electrode 220 and the P-type gate electrode 222 are formed between the gate endcap isolations structures 214, but form a P/N junction 224 where they meet. The exact location of the P/N junction 224 may vary, depending on mis-registration, as depicted by the arrowed region 226.

Figure 3C:
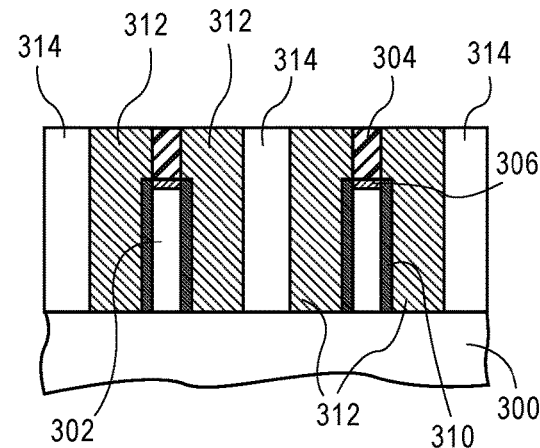
Figure 3D:
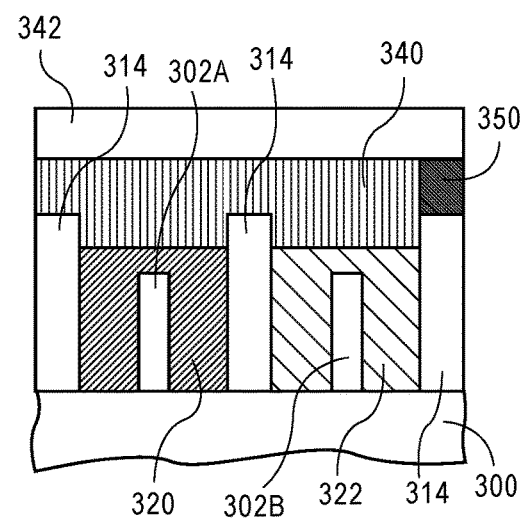

By contrast, referring to FIG. 3D, the hardmask layer 304 and pad oxide layer 306 are removed, and the dummy spacers 314 of FIG. 3C are replaced with permanent gate electrodes. In the case of use of a dummy gate dielectric layer, such a dummy gate dielectric layer may also be replaced by a permanent gate dielectric layer in this process. In the specific example shown, a dual metal gate replacement process is performed to provide an N-type gate electrode 320 over a first semiconductor fin 302A and to provide a P-type gate electrode 322 over a second semiconductor fin 302B. The N-type gate electrode 320 and the P-type gate electrode 322 are formed between, and are also separated by, the gate endcap isolations structures 314.

Referring again to FIG. 2D, a local interconnect 240 may be fabricated to contact N-type gate electrode 220 and P-type gate electrode 322 to provide a conductive path around the P/N junction 224. Likewise, referring to FIG. 3D, a local interconnect 340 may be fabricated to contact N-type gate electrode 320 and P-type gate electrode 322 to provide a conductive path over the intervening isolation structure 314 there between. Referring to both FIGS. 2D and 3D, a hardmask 242 or 342 may be formed on the local interconnect 240 or 340, respectively.

Referring to FIG. 3D in particular, in an embodiment, the continuity of the local interconnect 340 is interrupted by a dielectric plug 350 in cases where a break in electrical contact along a gate line are needed. As used, herein, the term "plug" is used to refer to a non-conductive space or interruption of a metal or otherwise conductive structure, such as an interruption of a local interconnect feature.

In accordance with one or more embodiments of the present disclosure, a self-aligned gate endcap (SAGE) processing scheme involves the formation of gate/trench contact endcaps self-aligned to fins without requiring an extra length to account for mask mis-registration. Thus, embodiments may be implemented to enable shrinking of transistor layout area. Furthermore, a flexible fin-height (e.g., multi Hsi) process may enable independent optimization of different cells for power and performance. An integrated process flow enabling both features may be implemented to meet scaling and performance challenges for future CMOS technology. Embodiments described herein may involve the fabrication of gate endcap isolation structures, which may also be referred to as gate walls or SAGE walls.

It is to be appreciated that a self-aligned gate end (SAGE) architecture provides a potential landing spot for a gate plug or a contact plug. The plug patterning relies on etching holes into a sacrificial hardmask or other etchable film, followed by filling the resultant hole with an insulating material. The bulk sacrificial film is then removed prior to a metal fill process. With aggressive scaling of gate dimensions, etching holes in a high aspect ratio and subsequent fill with insulators can be challenging and may result in the formation of voids or process defects. For example, any unetched polymer or sliver in the plug can fill with metal, creating metal in plug defects that short the two segments that are otherwise intended to be insulated by the plug. Accordingly, state-of-the-art processing schemes for plug patterning and fill may be susceptible to metal-in-plug defects that can provide a leakage path and short the two nodes across a plug.

In an exemplary fabrication process highlighting the potential for metal short (e.g., leakage path or conductive short) formation during plug fill of a SAGE architecture, FIGS. 4A-4F illustrate cross-sectional views representing various operations in a method of fabricating an integrated circuit structure including a self-aligned gate endcap (SAGE)-integrated plug with imperfect fill, in accordance with an embodiment of the present disclosure.

Figure 4A:
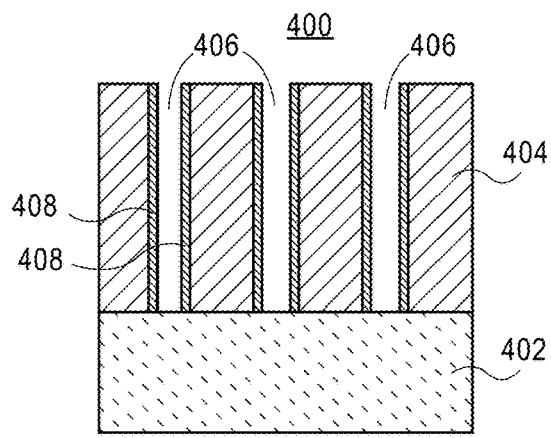
FIGS. 4A-4F illustrate cross-sectional views representing various operations in a method of fabricating an integrated circuit structure including a self-aligned gate endcap (SAGE)-integrated plug with imperfect fill, in accordance with an embodiment of the present disclosure.

Referring to FIG. 4A, a starting structure 400 includes an inter-layer dielectric (ILD) layer 404 formed over a gate endcap isolation structure 402. The ILD layer 404 includes trenches 406, e.g., lines of trenches, formed therein and exposing portions of the gate endcap isolation structure 402.

In one embodiment, dielectric spacers 408 are along sidewalls of each of the trenches 406. In one embodiment, the starting structure 400 represents a stage in a fabrication where dummy gate structures have been removed in a replacement gate process. The gate structures in locations off of the gate endcap isolation structure 402 may have been filled with metal gate material and recessed. The recessing leaves empty trenches 406 above the gate endcap isolation structure 402. However, a gate insulating cap may not have yet been formed. In one embodiment, the gate endcap isolation structure 402 is a self-aligned gate endcap (SAGE) structure formed above a substrate.

Figure 4B:
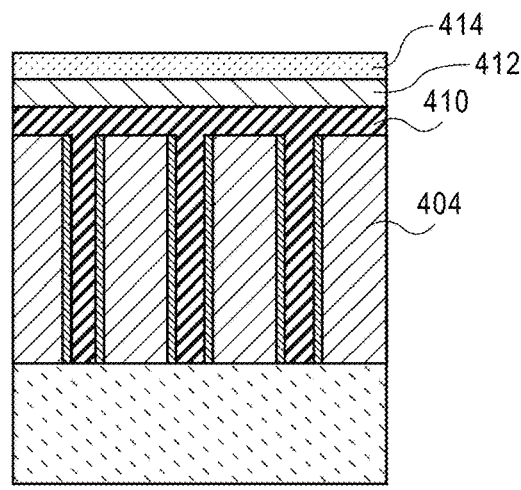

Referring to FIG. 4B, a blocking layer 410 is formed in the plurality of gate trenches 406 in the ILD layer 404. In one embodiment, the blocking layer 410 is a carbon-based material deposited using a spin-on process, which may be followed by a planarization process. First hardmask 412 and second hardmask 414 layer may be formed on the blocking layer to facilitate patterning of the blocking layer 410.

Figure 4C:
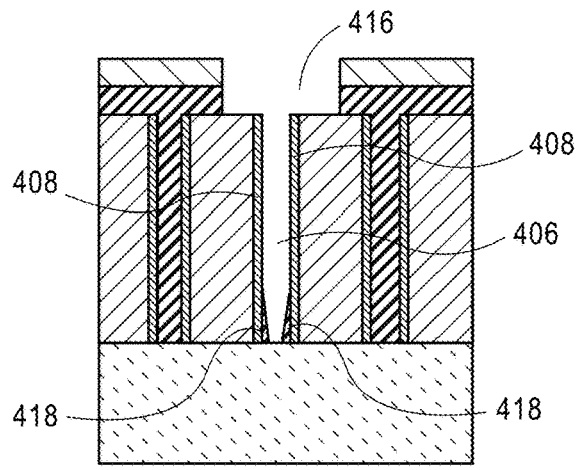

Referring to FIG. 4C, the blocking layer 410 is removed from one of the plurality of gate trenches 406, such as the middle trench of FIG. 4C, to form an opening 416. In one embodiment, the process of removing the blocking layer 410 from the middle trench leaves slivers 418 which are a residual portion of the blocking layer 410 remaining along the sidewalls of the middle gate trench 406 or, if present, along the dielectric spacers 408 along the sidewalls of the middle gate trench 406.

In an embodiment, opening 416 is formed using a high aspect ratio dry etch process. In one such embodiment, the etch process provides a driven etch taper to leave slivers 418 which may be disposable. In an example where blocking layer 410 is a carbon-based spin-on material, the blocking layer 410 is etched with a highly anisotropic process employing etching techniques to ensure vertical profiles. The dry etch leaves slivers of the carbon-based spin-on material at the bottom of the opened trench due to the high aspect ratio. In one embodiment, the slivers 418 of the blocking layer 410 have a tapered profile with a thinner upper portion and slightly wider lower portion.

Figure 4D:
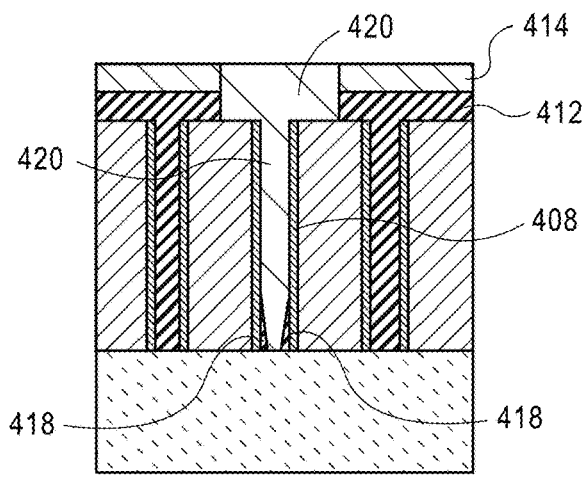

Referring to FIG. 4D, a dielectric layer 420 is formed in opening 416 in the middle gate trench 406. In one embodiment, the dielectric layer 420 is formed adjacent to the slivers 418 of the residual portion of the blocking layer 410. The dielectric layer 420 may represent a dielectric "plug" feature that, if not for slivers 418, would completely fill select ones of the gate trenches 406 to provide an electrical discontinuity between conductive features. In one embodiment, the dielectric layer 420 is formed at the same time that other complete dielectric plugs are being formed elsewhere on the integrated circuit structure. Additionally or alternatively, the dielectric layer 420 may be formed during the formation of gate insulating capping layers. In one embodiment, the dielectric layer 420 is formed using a deposition and planarization process.

Figure 4E:
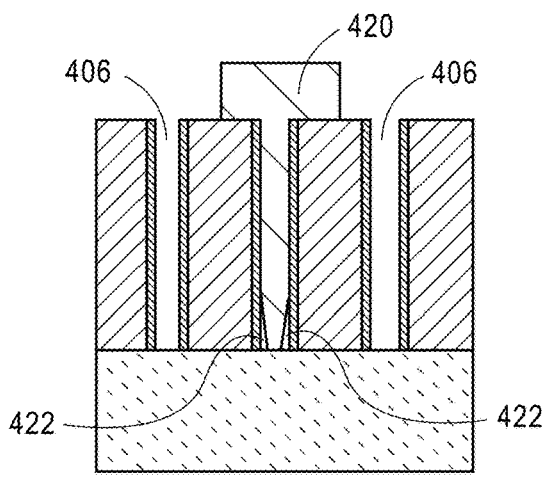
Figure 4F:
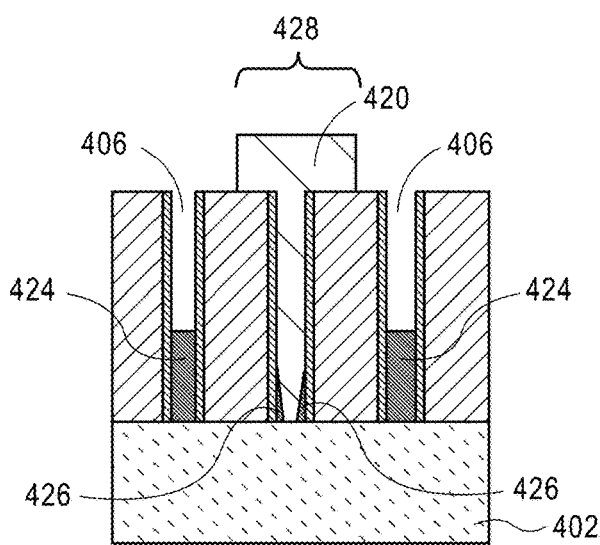

Referring to FIG. 4E, remaining portions of the blocking layer 410 and hardmask layers 412 and 414 are removed. In particular, the blocking layer 410 is removed from trenches 406 adjacent to the middle trench, while the dielectric layer 420 is retained. In an embodiment, the process used to remove the remaining portions of the blocking layer 410 also removes the slivers 418 to form voids 422. In one such embodiment, an ash process is used to remove the remaining portions of the blocking layer 410 and the slivers 418.

Referring again to FIG. 4F, metal gate electrode portions 424 are formed in the adjacent, opened, trenches 406, e.g., the two outer trenches of FIG. 4F. Such metal gate electrode portions 424 are continuous with (i.e., effectively couple) a pair of gate structures formed on either side of the gate endcap isolation structure 402. It is to be appreciated that the above described process flow is also relevant for trench contact (e.g., source or drain contact structure) formation.

Referring again to FIG. 4F, during gate metal fill to form metal gate electrode portions 424, a conductive material is formed in the voids 422 between the dielectric layer 420 and the sidewalls of the middle gate trench 406. In one such embodiment, the conductive material completely fills the voids 422 to form metal slivers 426 having substantially the same size and geometry as the voids 422. In a particular such embodiment, the metal slivers 426 each have a tapered profile with a thinner upper portion and slightly wider lower portion. In an embodiment, the metal slivers 426 are confined to the middle trench 406 by the dielectric layer 420 and may effectively provide a leakage path or conductive short. In an embodiment, a process that results in formation of the leakage path or conductive short (e.g., slivers 426) can be viewed as a failed plug process, since conductive slivers 426 remain inside of a trench 406 that is otherwise be targeted from dielectric plug formation.

Accordingly, in a state-of-the art SAGE process scheme, a sacrificial hardmask is globally deposited and then patterned to etch holes which will form the gate or contact plugs. These holes are filled with an insulator and the sacrificial hardmask removed and then subsequently the gate or contact space is filled with metal. Due to scaled gate and contact dimensions of logic transistors on state-of-the-art process technologies, the patterning to create such holes and the subsequent insulator fill can be quite challenging and may cause functionality defects where there are voids or metal pathways inside the plug that short the two nodes that the plug is supposed to isolate.

By contrast, in accordance with one or more embodiments of the present disclosure, self-aligned plugs are effectively formed prior to gate or contact formation in an orthogonal configuration to the gates and contacts. The result is an intermediate structure that includes a plug in all possible locations. A sacrificial hardmask is then used to pattern the grid to trim away or recess the unwanted plugs. The sacrificial film is subsequently removed and gate and contact metals are filled and are isolated by remaining plugs (e.g., unetched locations of a SAGE wall). That is, a self-aligned wall (SAW) is fabricated to run perpendicular to gates/contacts and is as tall as the final desired gate height. The SAW is fabricated at that height prior to gate and contact patterning. A sacrificial hardmask is then globally deposited. A pattern is formed to preserve tall portions of the SAW that will become a plug, and to reduce in height other portions of the SAW to allow continuous gate or contact pathways over select locations of the SAGE wall. The SAW is then recessed in the latter regions. The sacrificial material is removed and the resulting trenches are filled with contact or gate material.

Figure 5A:
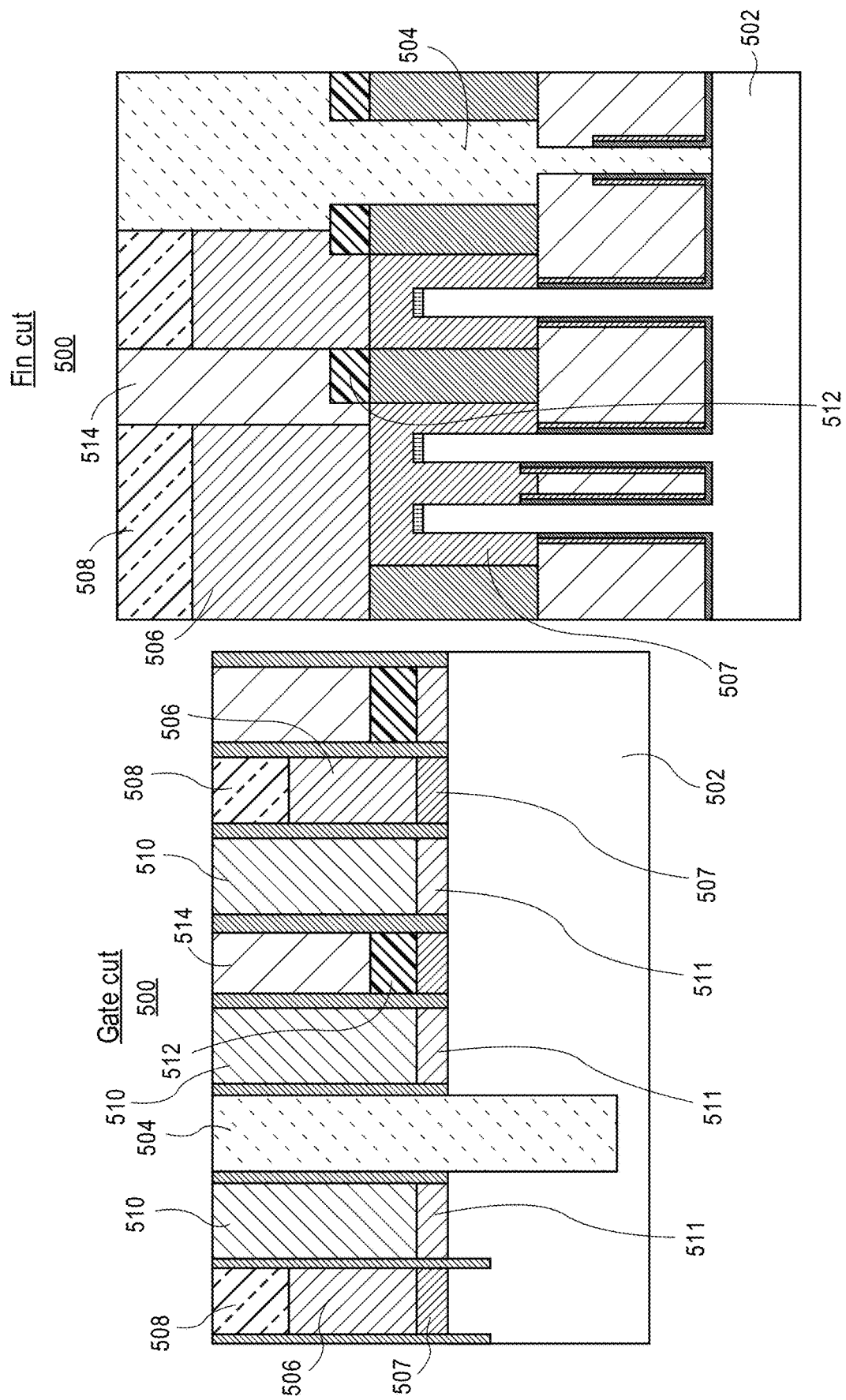
FIG. 5A illustrates cross-sectional views of an integrated circuit structure having a gate plug and a contact plug based on a state-of the-art SAGE processing scheme, as taken along a gate cut and a fin cut, in accordance with an embodiment of the present disclosure.

FIG. 5A illustrates cross-sectional views of an integrated circuit structure having a gate plug and a contact plug based on a state-of the-art SAGE processing scheme, as taken along a gate cut and a fin cut, in accordance with an embodiment of the present disclosure.

Referring to FIG. 5A, an integrated circuit structure 500 includes a semiconductor fin 502. A fin trim isolation structure 504 isolates the fin 502 into two different portions. Gate structures include an upper metal gate electrode layer 506 on a lower metal gate electrode layer 507, and a gate insulating cap layer 508 on the upper metal gate electrode layer 506. Contact structures include an upper metal contact layer 510 on a lower metal contact layer 511. A SAGE wall 512 (which may include an upper insulating material portion above a lower insulating material portion) has a gate plug 514 formed thereon. Contact plugs are similarly formed, e.g., the plug structure at the far right of the gate cut cross-sectional view.

Figure 5B:
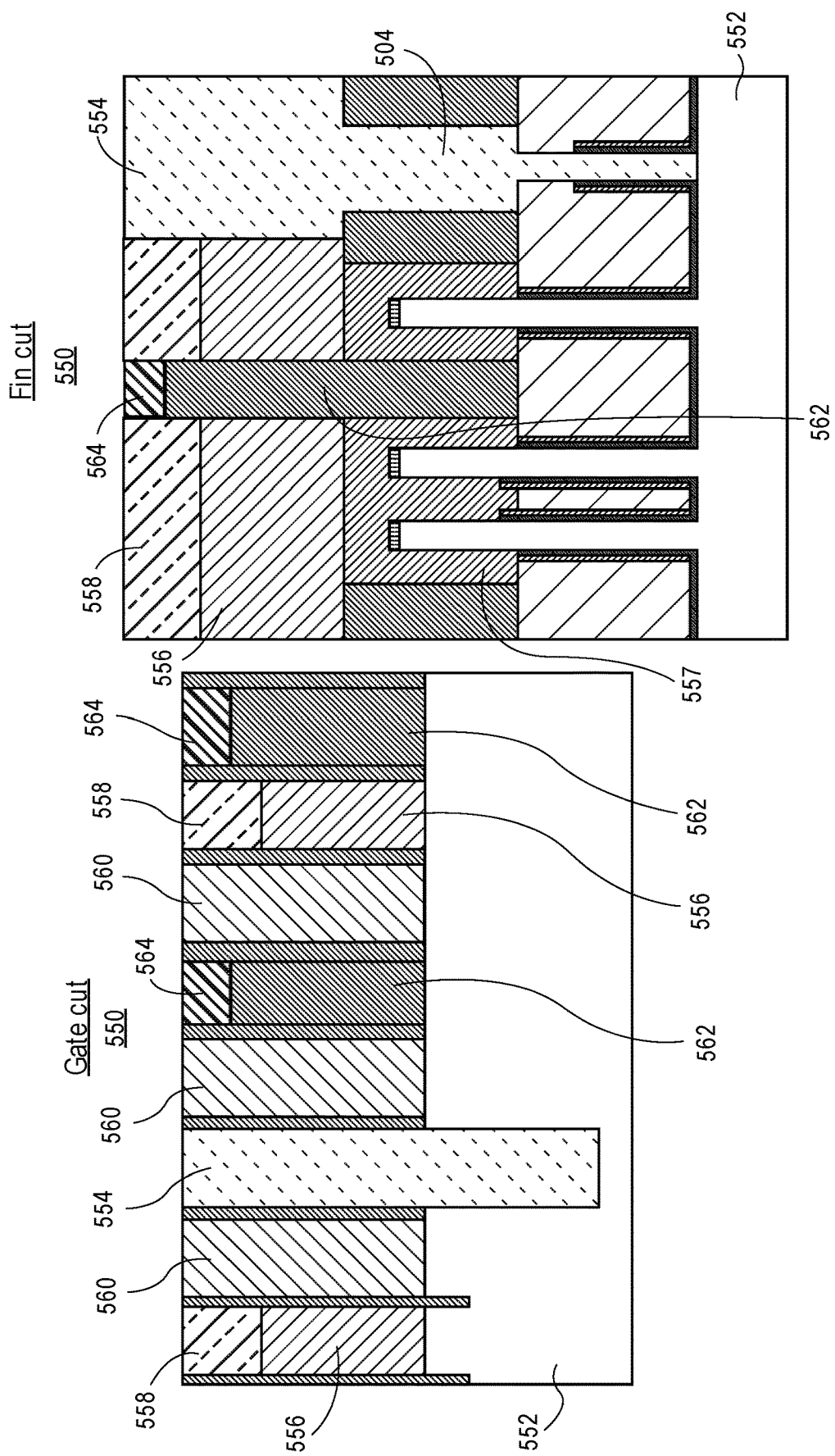
FIG. 5B illustrates cross-sectional views of an integrated circuit structure having a gate endcap plug and a contact endcap plug, as taken along a gate cut and a fin cut, in accordance with an embodiment of the present disclosure.

By contrast to FIG. 5A, FIG. 5B illustrates cross-sectional views of an integrated circuit structure having a gate endcap plug and a contact endcap plug, as taken along a gate cut and a fin cut, in accordance with an embodiment of the present disclosure.

Referring to FIG. 5B, an integrated circuit structure 550 includes a semiconductor fin 552. A fin trim isolation structure 554 isolates the fin 552 into two different portions. Gate structures include a metal gate electrode layer (which may include an upper layer 556 and a lower layer 557), and a gate insulating cap layer 558 on the metal gate electrode layer 556. Contact structures include a metal contact layer 560. A SAGE wall 562/564 (which may include an upper insulating material portion 564 above a lower insulating material portion 562) has not been recessed in certain locations and, as such, acts as a gate endcap plug (left-hand 562/564 of gate cut) or a contact endcap plug (right-hand 562/564 of gate cut).

With reference again to the structure of FIG. 5B as opposed to FIG. 5A, in accordance with one or more embodiments of the present disclosure, an integrated circuit structure includes a plurality of semiconductor fins protruding through a trench isolation region above a substrate. A first gate structure is over a first of the plurality of semiconductor fins (e.g., first and second fins from left side of fin cut). A second gate structure is over the first of the plurality of semiconductor fins. A gate endcap isolation structure is in contact with the first gate structure and the second gate structure. The gate endcap isolation structure is on the trench isolation region and has a first upper surface co-planar with an uppermost surface of the first gate structure. The gate endcap isolation structure has a second upper surface below the first upper surface. A portion of the second gate structure is on the second upper surface of the gate endcap isolation structure. In an embodiment, the first upper surface of the gate endcap isolation structure is co-planar with an uppermost surface of a dielectric cap of the first gate structure.

With reference again to the structure of FIG. 5B as opposed to FIG. 5A, in accordance with one or more embodiments of the present disclosure, an integrated circuit structure includes a plurality of semiconductor fins protruding through a trench isolation region above a substrate. A first source or drain contact structure is over a first of the plurality of semiconductor fins. A second source or drain contact structure is over the first of the plurality of semiconductor fins. A gate endcap isolation structure is in contact with the first source or drain contact structure and the second source or drain contact structure. The gate endcap isolation structure is on the trench isolation region and has a first upper surface co-planar with an uppermost surface of the first source or drain contact structure. The gate endcap isolation structure has a second upper surface below the first upper surface. A portion of the second source or drain contact structure is on the second upper surface of the gate endcap isolation structure. In an embodiment, the first upper surface of the gate endcap isolation structure is co-planar with a conductive surface of the first source or drain contact structure.

Relevant to both above described embodiments, in an embodiment, the gate endcap isolation structure includes an upper dielectric layer on a lower dielectric layer, the upper dielectric layer having a greater dielectric constant than the lower dielectric layer. In an embodiment, the gate endcap isolation structure includes a centered vertical seam, such as described below.

As an exemplary processing scheme for contact endcap plug formation, FIGS. 6A-6E illustrates top-down angled double cross-sectional views of various operations in a method of fabricating an integrated circuit structure having contact endcap plugs, in accordance with an embodiment of the present disclosure.

Figure 6B:
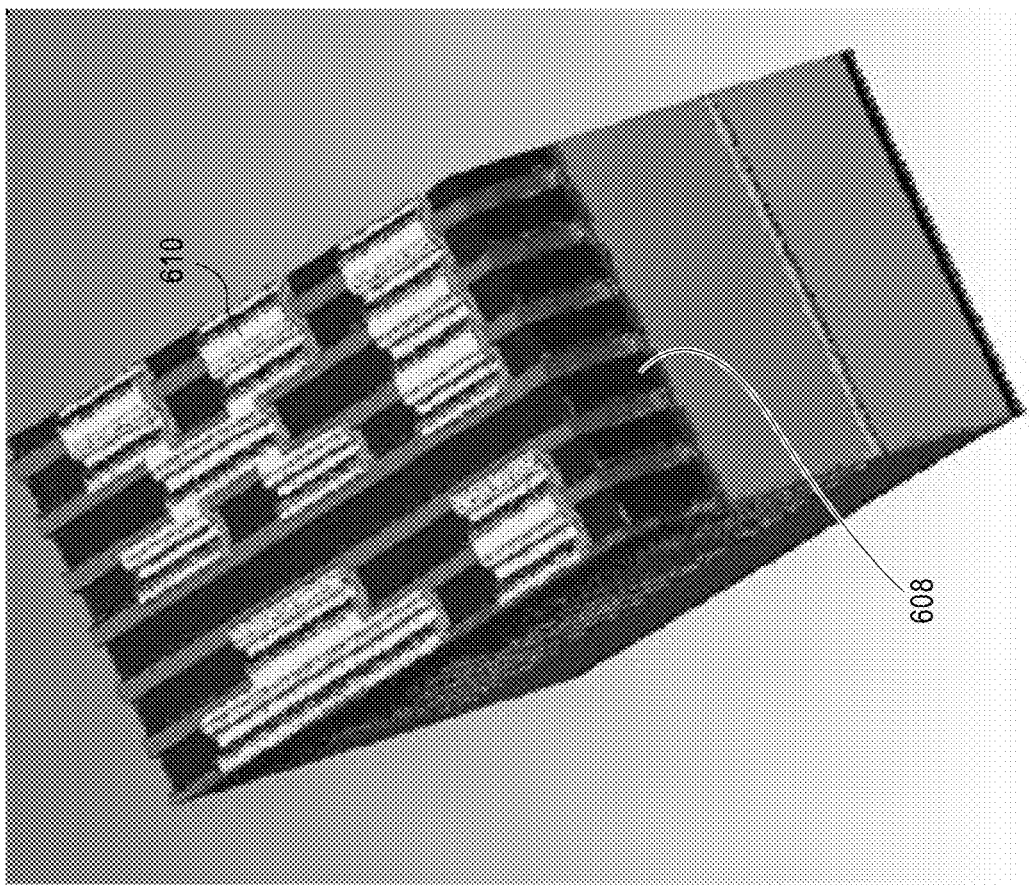
FIGS. 6A-6E illustrates top-down angled double cross-sectional views of various operations in a method of fabricating an integrated circuit structure having contact endcap plugs, in accordance with an embodiment of the present disclosure.
Figure 6A:
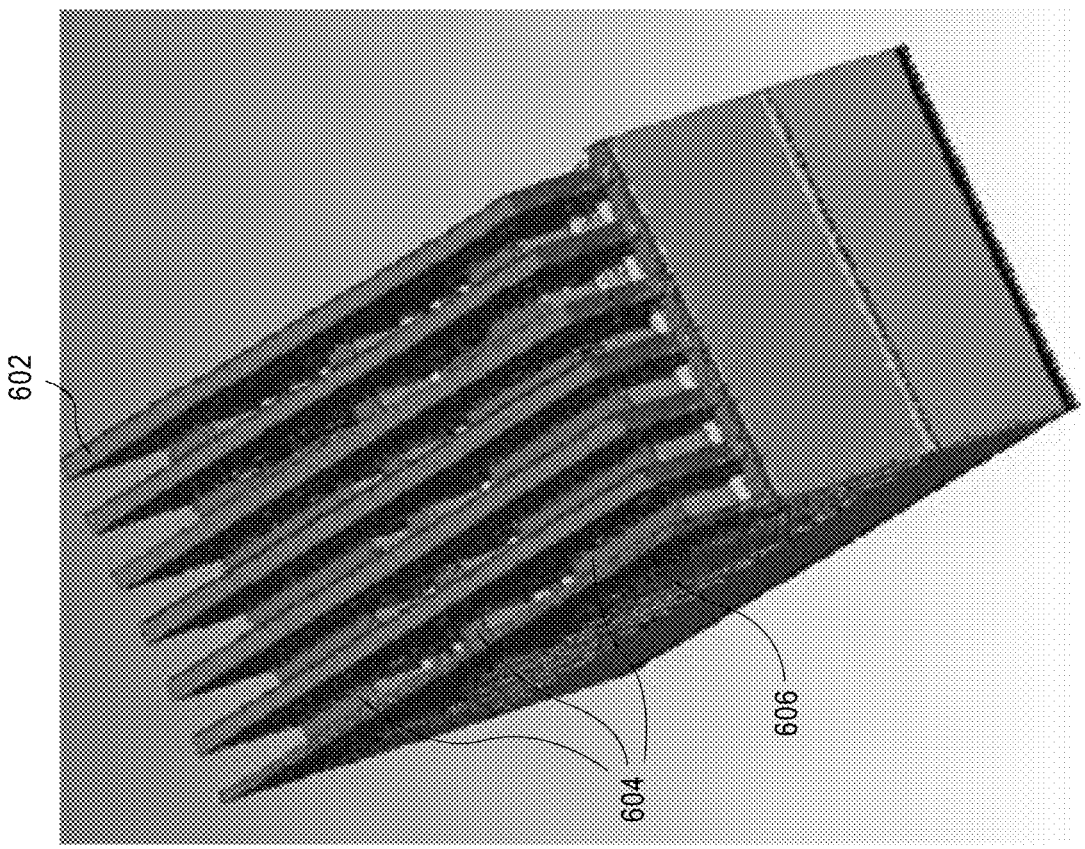
Figure 6D:
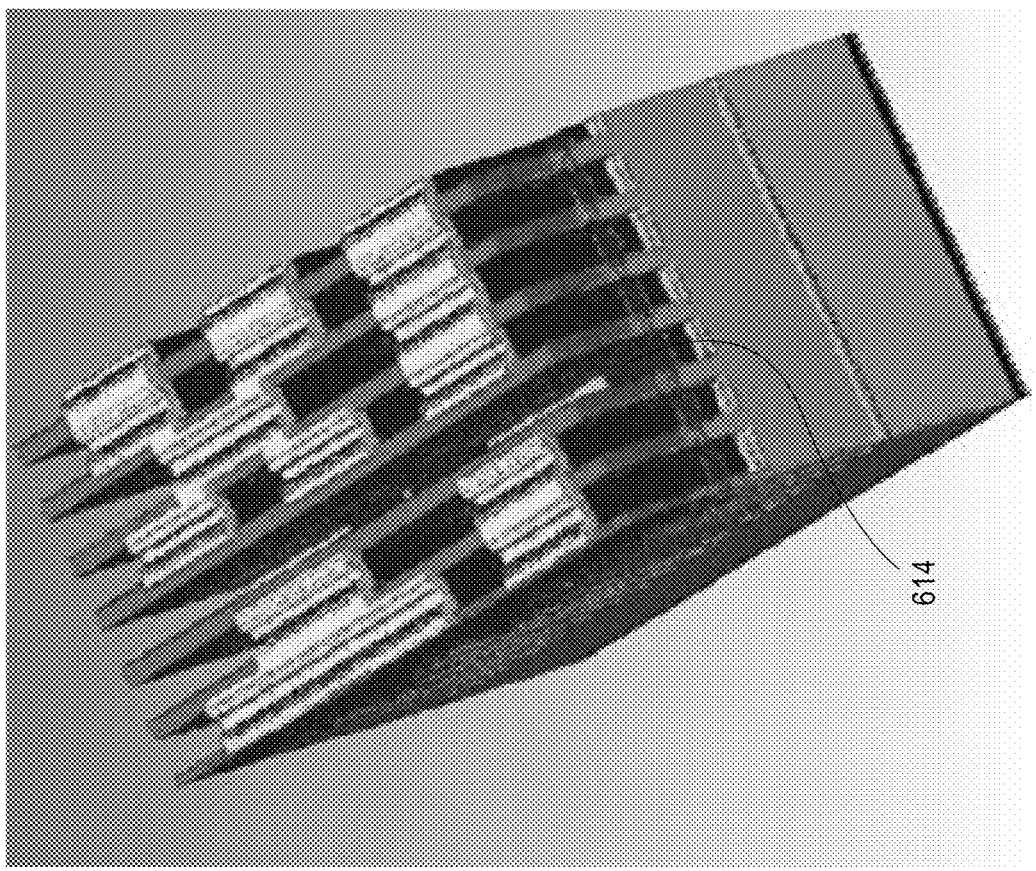
Figure 6C:
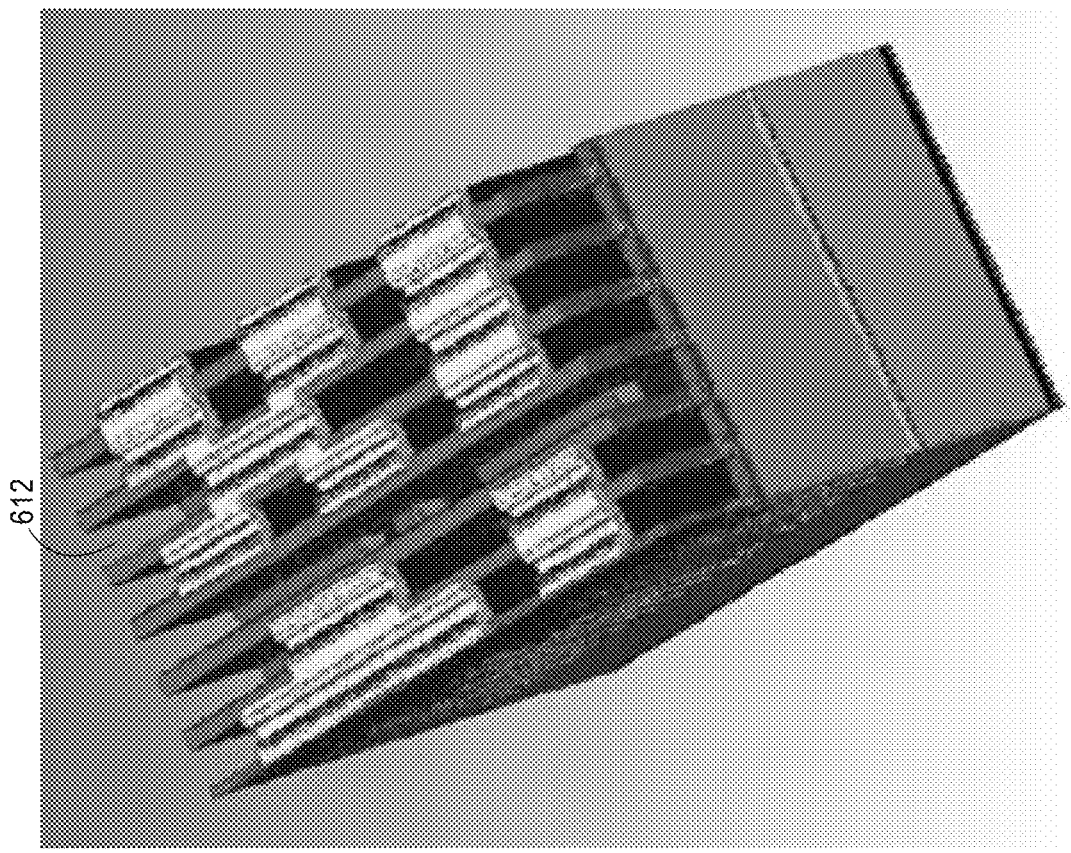
Figure 6E:
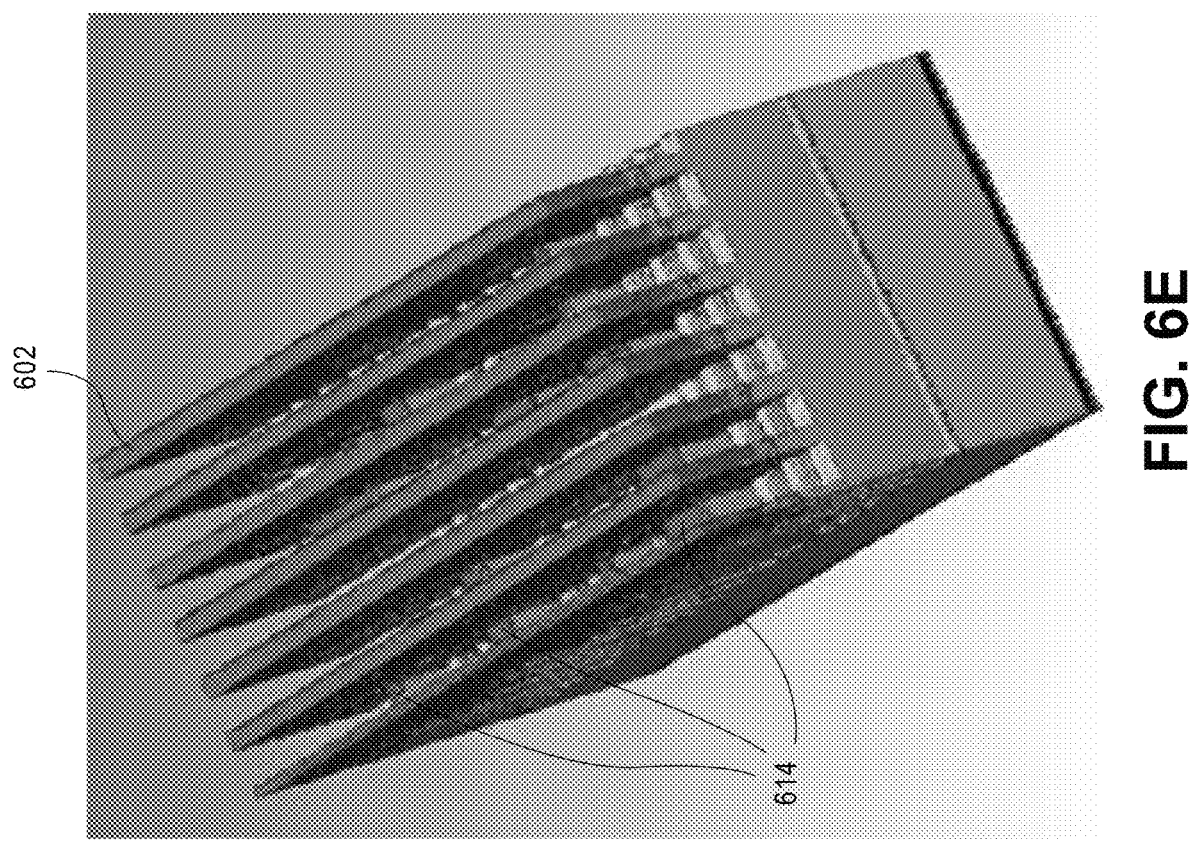

Referring to FIG. 6A, a patterning grid 602 is formed over a plurality of tall SAGE walls 604 formed along a plurality of fins 606. A sacrificial hardmask 608 is then deposited and a patterned mask 610 is formed thereon, as is depicted in FIG. 6B. Referring to FIG. 6C, the sacrificial hardmask is patterned to form openings 612 that reveal regions where the tall SAGE walls 604 are to be recessed. The tall SAGE walls 604 are then recessed in locations of the openings 612. The resulting SAGE walls 614 have tall locations with recessed locations, where the remaining tall locations represent a contact endcap plug. The remaining sacrificial hardmask 608 and the patterned mask 610 are then removed.

As an exemplary processing scheme for gate endcap plug formation, FIGS. 7A-7E illustrates top-down angled double cross-sectional views of various operations in a method of fabricating an integrated circuit structure having gate endcap plugs, in accordance with an embodiment of the present disclosure.

Figures 7A, 7B:
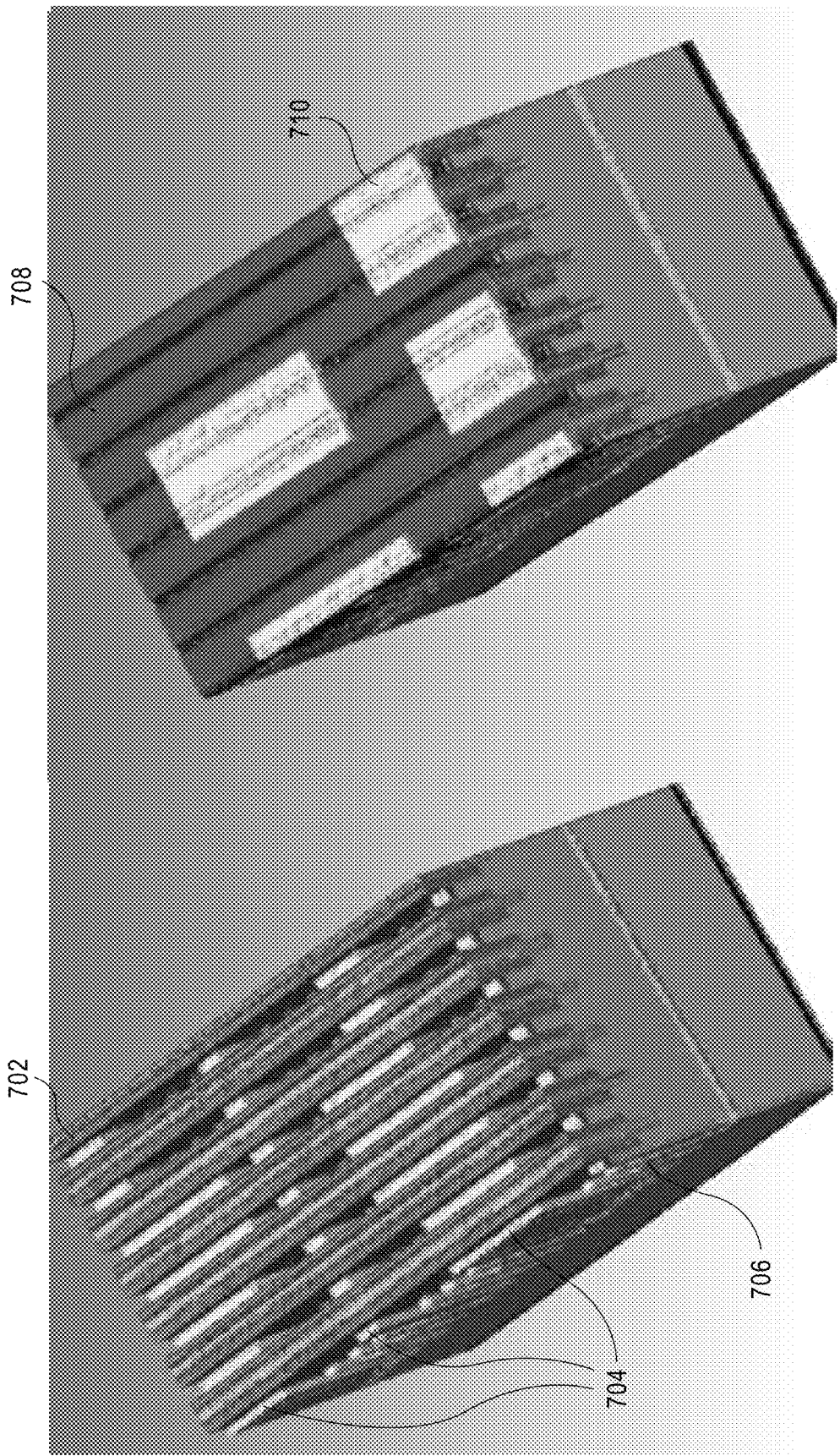
Figure 7E:
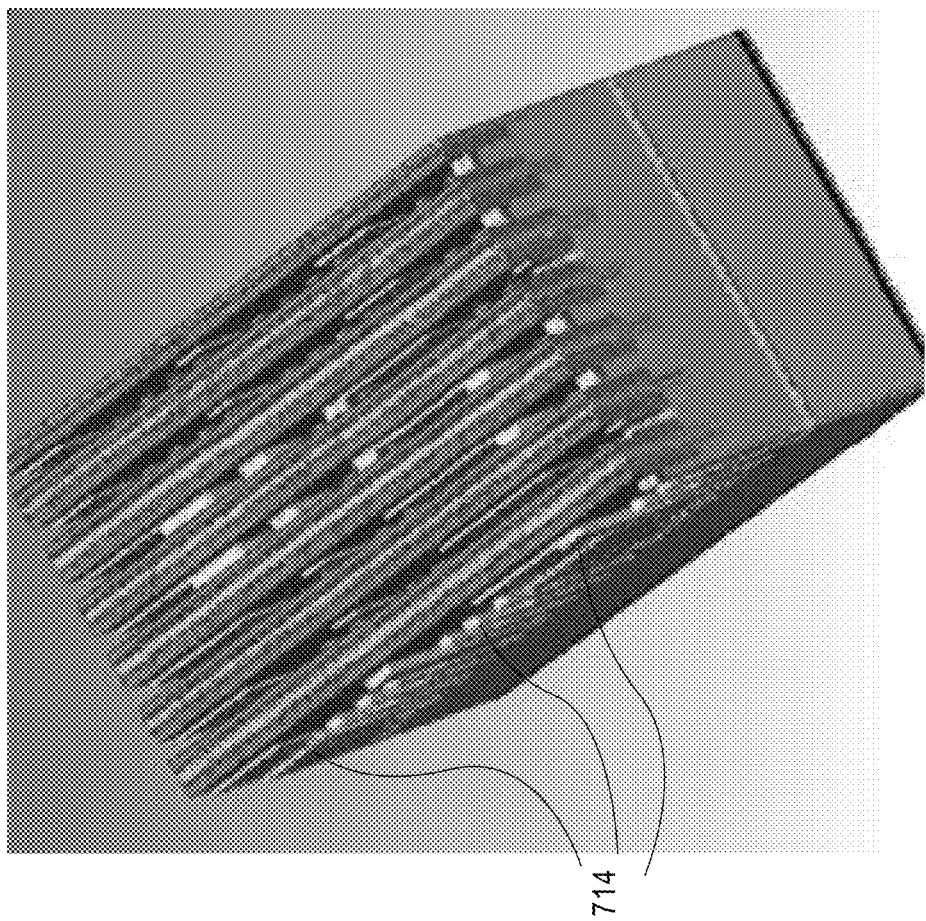

Referring to FIG. 7A, a patterning grid 702 is formed over a plurality of tall SAGE walls 704 formed along a plurality of fins 706. A sacrificial hardmask 708 is then deposited and a patterned mask 710 is formed thereon, as is depicted in FIG. 7B. Referring to FIG. 7C, the sacrificial hardmask is patterned to form openings 712 that reveal regions where the tall SAGE walls 704 are to be recessed. The tall SAGE walls 704 are then recessed in locations of the openings 712. The resulting SAGE walls 714 have tall locations with recessed locations, where the remaining tall locations represent a contact endcap plug. The remaining sacrificial hardmask 708 and the patterned mask 7610 are then removed. It is to be appreciated that the processing schemes of FIGS. 7A-7E and FIGS. 6A-6E may be combined to provide SAGE walls having recessed locations and having tall locations that act as gate endcap plugs or contact endcap plugs. As such, a contact endcap plug may be part of a continuous structure that also includes a gate endcap plug.

In another aspect, SAGE walls described herein may be slightly or substantially embedded in an isolation regions separating adjacent fins of an integrated circuit structure. Additionally, or alternatively, SAGE walls described herein may be composed of more than one dielectric layer.

Figure 8:
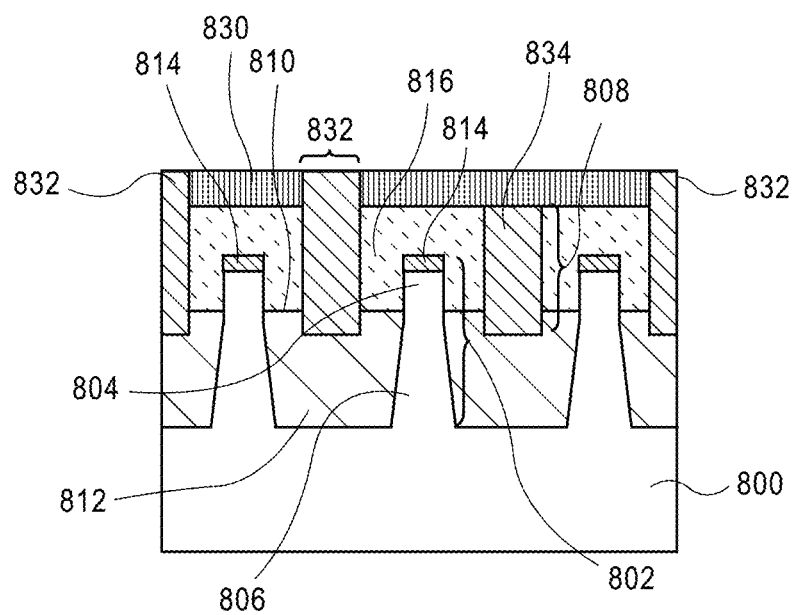
FIG. 8 illustrates a cross-sectional view of an integrated circuit structure including a self-aligned gate endcap (SAGE)-integrated gate endcap plug, as taken through a fin cut perspective, in accordance with an embodiment of the present disclosure.

In an example involving slight recess of a SAGE wall, e.g., as recessed into an initially planar isolation structure, FIG. 8 illustrates a cross-sectional view of an integrated circuit structure including a self-aligned gate endcap (SAGE)-integrated gate endcap plug, as taken through a fin cut perspective, in accordance with an embodiment of the present disclosure.

Referring to FIG. 8, a plurality of fins 802 is protruding from a substrate 800. Each of the plurality of fins 802 has an upper portion 804 and a lower portion 806. The upper portions 804 are between but lower than gate endcap isolation structures (SAGE walls) 832/834. Also, the upper portions 804 are above an uppermost surface 810 of a trench isolation region 812. Although shown as retained in FIG. 8, it is to be appreciated that a top fin hardmask 814 can be removed prior to or during gate structure 816/830 formation. That is, top fin hardmask 814 may be removed to provide a tri-gate finFET device, or may ultimately be retained to provide a double gate finFET device.

Each of the SAGE walls 832/834 is slightly embedded in isolation region 812, below the uppermost surface 810 of the isolation region 812. SAGE walls 832 are shown as tall SAGE wall portions that act as a gate endcap plug and are co-planar with an upper metal layer 830 of the gate electrode 830/832. SAGE walls 834 is shown as a recessed SAGE wall portion that allows upper metal layer 830 of the gate electrode 830/832 to be over the SAGE wall 834. It is to be appreciated that contacts and contact endcap plugs may be similarly depicted.

Figure 9:
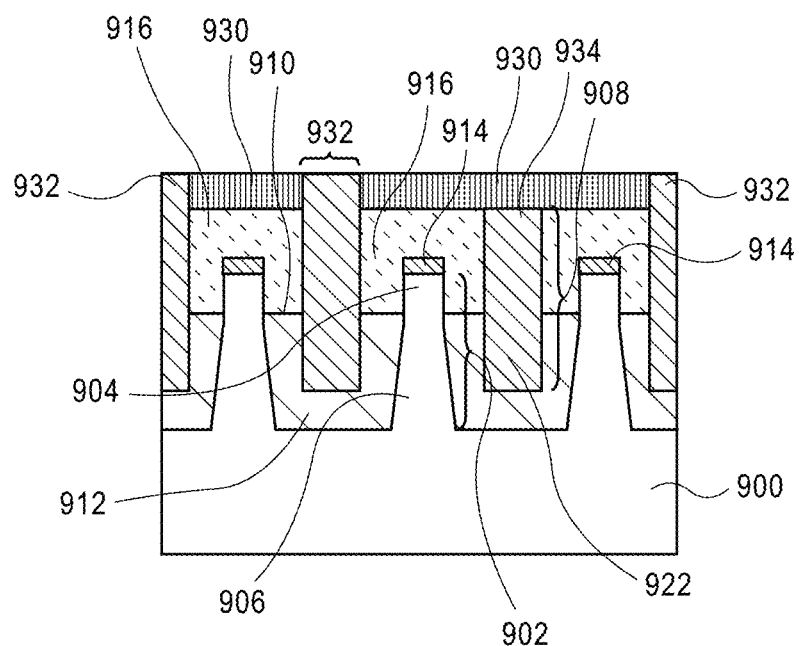
FIG. 9 illustrates a cross-sectional view of another integrated circuit structure including a self-aligned gate endcap (SAGE)-integrated gate endcap plug, as taken through a fin cut perspective, in accordance with another embodiment of the present disclosure.

In an example involving substantial recess of a SAGE wall into an isolation layer, e.g., as formed within a conformal isolation spacer, FIG. 9 illustrates a cross-sectional view of another integrated circuit structure including a self-aligned gate endcap (SAGE)-integrated gate endcap plug, as taken through a fin cut perspective, in accordance with another embodiment of the present disclosure.

Referring to FIG. 9, a plurality of fins 902 is protruding from a substrate 900. Each of the plurality of fins 902 has an upper portion 904 and a lower portion 906. The upper portions 904 are between but lower than gate endcap isolation structures (SAGE walls) 932/934. Also, the upper portions 904 are above an uppermost surface 910 of a trench isolation region 912. Although shown as retained in FIG. 9, it is to be appreciated that a top fin hardmask 914 can be removed prior to or during gate structure 916/930 formation. That is, top fin hardmask 914 may be removed to provide a tri-gate finFET device, or may ultimately be retained to provide a double gate finFET device.

Each of the SAGE walls 932/934 is substantially embedded in isolation region 912, below the uppermost surface 910 of the isolation region 912. SAGE walls 932 are shown as tall SAGE wall portions that act as a gate endcap plug and are co-planar with an upper metal layer 930 of the gate electrode 930/932. SAGE walls 934 is shown as a recessed SAGE wall portion that allows upper metal layer 930 of the gate electrode 930/932 to be over the SAGE wall 934. It is to be appreciated that contacts and contact endcap plugs may be similarly depicted.

With reference again to the structures of FIGS. 8 and 9, in accordance with one or more embodiments of the present disclosure, an integrated circuit structure includes a plurality of semiconductor fins protruding through a trench isolation region above a substrate. A first gate structure is over a first of the plurality of semiconductor fins. A second gate structure is over a second of the plurality of semiconductor fins. A first gate endcap isolation structure is laterally between and in contact with the first gate structure and the second gate structure. The first gate endcap isolation structure is on the trench isolation region and has an uppermost surface co-planar with an uppermost surface of the first gate structure and the second gate structure. A second gate endcap isolation structure is laterally between and in contact with first and second lateral portions of the first gate structure. The second gate endcap isolation structure is on the trench isolation region and has an uppermost surface below an uppermost surface of the first gate structure. A portion of the first gate structure is on the uppermost surface of the second gate endcap isolation structure. In an embodiment, the uppermost surface of the first gate endcap isolation structure is co-planar with an uppermost surface of a dielectric cap of each of the first gate structure and the second gate structure.

With reference again to the structures of FIGS. 8 and 9, in accordance with one or more embodiments of the present disclosure, an integrated circuit structure includes a plurality of semiconductor fins protruding through a trench isolation region above a substrate. A first source or drain contact structure is over a first of the plurality of semiconductor fins. A second source or drain contact structure is over a second of the plurality of semiconductor fins. A first gate endcap isolation structure is laterally between and in contact with the first source or drain contact structure and the second source or drain contact structure. The first gate endcap isolation structure is on the trench isolation region and has an uppermost surface co-planar with an uppermost surface of the first source or drain contact structure and the second source or drain contact structure. A second gate endcap isolation structure is laterally between and in contact with first and second lateral portions of the first source or drain contact structure. The second gate endcap isolation structure is on the trench isolation region and has an uppermost surface below an uppermost surface of the first source or drain contact structure. A portion of the first source or drain contact structure is on the uppermost surface of the second gate endcap isolation structure. In an embodiment, the uppermost surface of the first gate endcap isolation structure is co-planar with a conductive surface of each of the first source or drain contact structure and the second source or drain contact structure.

Relevant to both above described embodiments, in an embodiment, one or both of the first gate endcap isolation structure and the second gate endcap isolation structure includes an upper dielectric layer on a lower dielectric layer, the upper dielectric layer having a greater dielectric constant than the lower dielectric layer. In an embodiment, one or both of the first gate endcap isolation structure and the second gate endcap isolation structure includes a centered vertical seam, such as described below. In an embodiment, the first gate endcap isolation structure is wider than the second gate endcap isolation structure, such as described below. In an embodiment, the second gate endcap isolation structure is wider than the first gate endcap isolation structure, such as described below.

More generally, one or more embodiments described herein provide an avenue for area scaling, reducing capacitance, and/or eliminating various critical front end masks, such as gate cut masks. In one such embodiment the width of a minimum transistor can be reduced by up to 30% by implementing one or more of the approaches describe herein. The smaller transistor size reduces the capacitance between the gate and TCN and other parasitic capacitances. In one embodiment, no extra mask operations are needed to create the endcaps, contacts and local interconnect lines so the many masks needed for such features in the standard process are eliminated.

More specifically, key features of one or more embodiments described above may include one or more of: (1) the gate endcap is the distance from the fin endcap to the isolation endcap. This distance is defined by the spacer width and is the same size for all transistors. No lithographic patterning is needed to define the endcap so there is no need to allow for mask registration in the endcap; (2) The TCN overlap of the fin is determined by the spacer width and is also not affected by mask registration. Embodiments may be applicable to the 7 nm node generation, e.g., to improve transistor layout density and gate capacitance (dynamic energy and performance improvement) and reduce total mask count.

Figure 10A:
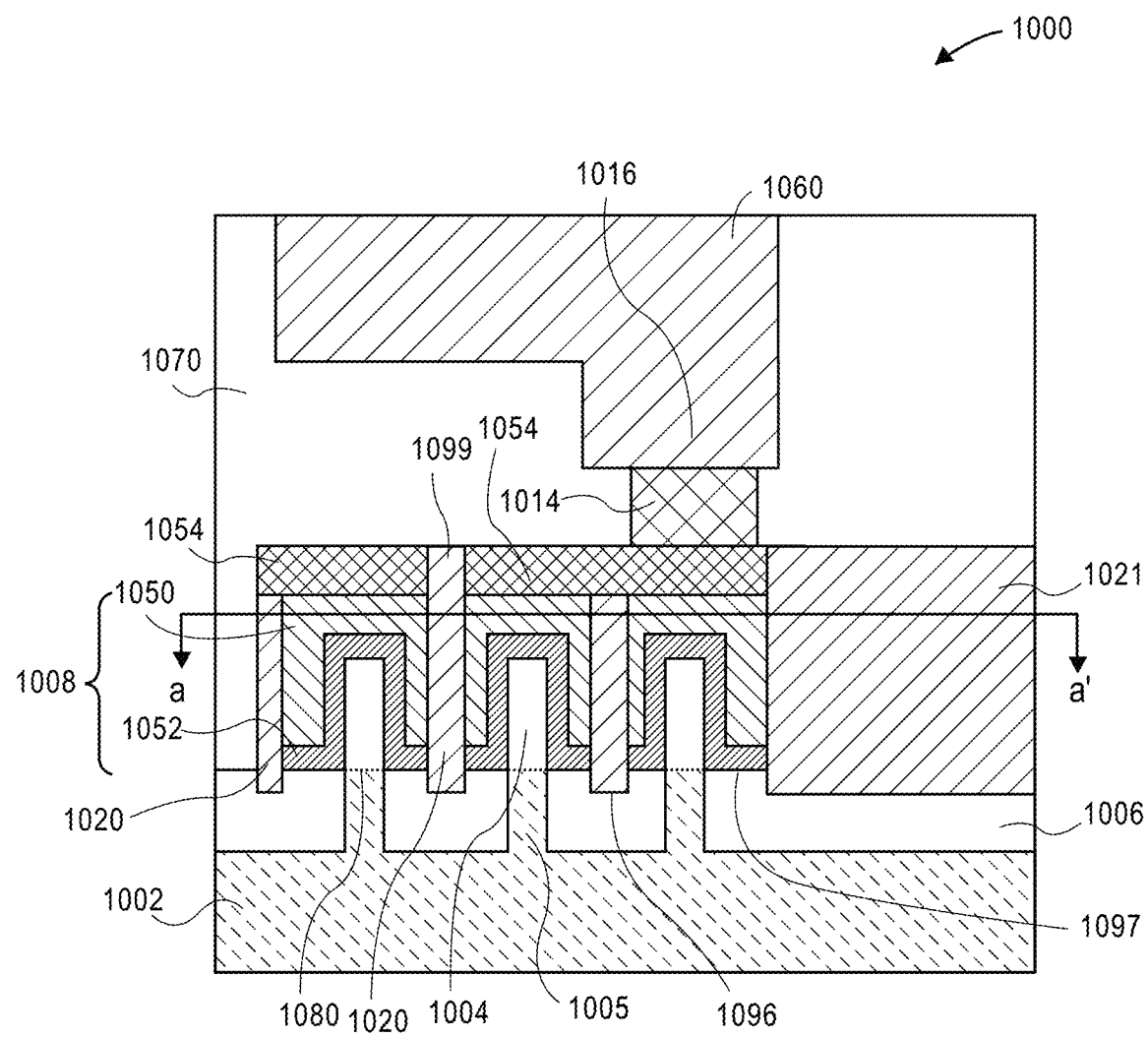
FIG. 10A illustrates a cross-sectional view of a non-planar integrated circuit structure having self-aligned gate endcap isolation integrated with gate endcap plugs, in accordance with an embodiment of the present disclosure.
Figure 10B:
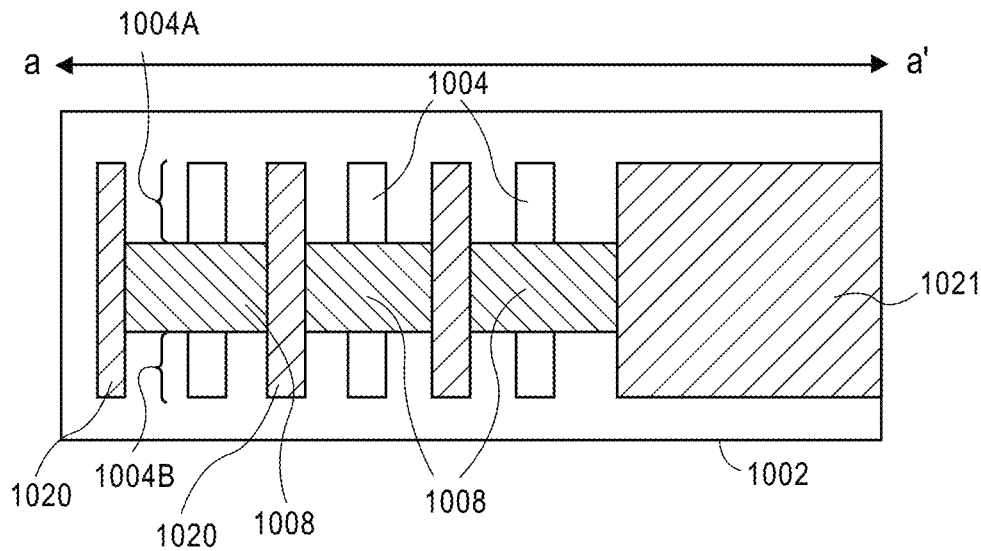
FIG. 10B illustrates a plan view taken along the a-a' axis of the structure of FIG. 10A, in accordance with an embodiment of the present disclosure.

It is to be appreciated that the structures resulting from the above exemplary processing schemes may be used in a same or similar form for subsequent processing operations to complete device fabrication, such as PMOS and NMOS device fabrication. As an example of such a device, FIG. 10A illustrates a cross-sectional view of a non-planar integrated circuit structure having self-aligned gate endcap isolation integrated with gate endcap plugs, in accordance with an embodiment of the present disclosure. FIG. 10B illustrates a plan view taken along the a-a' axis of the structure of FIG. 10A, in accordance with an embodiment of the present disclosure.

Referring to FIG. 10A, an integrated circuit structure or device 1000 includes a non-planar active regions (e.g., a fin structures including protruding fin portion 1004 and sub-fin region 1005) formed from substrate 1002, and within isolation region 1006. In an embodiment, the fin structures are a plurality of fin lines that form a grating structure such as a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, grating-like fin patterns may have lines spaced at a constant pitch and having a constant width. The pattern may be fabricated by a pitch halving or pitch quartering, or other pitch division, approach.

Gate structures 1008 are disposed over the protruding portions 1004 of the non-planar active regions as well as over a portion of the isolation region 1006. As shown, gate structures 1008 include a lower gate electrode 1050 layer, an upper gate electrode layer 1054, and a gate dielectric layer 1052. In one embodiment, although not shown, gate structures 1008 may also include a dielectric cap layer.

Gate structures 1008 are separated by narrow self-aligned gate endcap (SAGE) isolation structures or walls 1020 or wide SAGE isolation structures or walls 1021. In an embodiment, each of the SAGE walls 1020 and 1021 is recessed below an uppermost surface 1097 of the isolation region 1006, as is depicted in FIG. 10A.

One of the SAGE walls 1020 (labeled as 1099) and SAGE wall 1021 are shown as tall SAGE wall portions that act as a gate endcap plug and are co-planar with the upper metal layer 1054 of the gate electrode 1050/1054. The remaining two SAGE walls 1020 are shown as recessed SAGE wall portions that allow upper metal layer 1054 of the gate electrode 1050/1054 to be over the SAGE wall 1020. It is to be appreciated that contacts and contact endcap plugs may be similarly depicted, and would be into or out of the page.

A gate contact 1014, and overlying gate contact via 1016 are also seen from this perspective, along with an overlying metal interconnect 1060, all of which are disposed in interlayer dielectric stacks or layers 1070. Also seen from the perspective of FIG. 10A, the gate contact 1014 is, in one embodiment, disposed over the non-planar active regions. As is also depicted in FIG. 10A, an interface 1080 exists between a doping profile of protruding fin portions 1004 and sub-fin regions 1005, although other embodiments do not include such an interface in doping profile between these regions.

Referring to FIG. 10B, the gate structures 1008 are shown as disposed over the protruding fin portions 1004, as isolated by self-aligned gate endcap isolation structures 1020 and 1021. In an embodiment, the gate structures 1008 form one line of a plurality of parallel gate lines that form a grating structure such as a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, grating-like gate patterns may have lines spaced at a constant pitch and having a constant width. The pattern may be fabricated by a pitch halving or pitch quartering, or other pitch division, approach.

Referring again to FIG. 10B, source and drain regions 1004A and 1004B of the protruding fin portions 1004 are shown in this perspective, although it is to be appreciated that these regions would be overlapped with trench contact structures. In one embodiment, the source and drain regions 1004A and 1004B are doped portions of original material of the protruding fin portions 1004. In another embodiment, the material of the protruding fin portions 1004 is removed and replaced with another semiconductor material, e.g., by epitaxial deposition. In either case, the source and drain regions 1004A and 1004B may extend below the height of dielectric layer 1006, i.e., into the sub-fin region 1005.

In an embodiment, the integrated circuit structure or device 1000 is a non-planar device such as, but not limited to, a finFET or a tri-gate device. In such an embodiment, a corresponding semiconducting channel region is composed of or is formed in a three-dimensional body. In one such embodiment, the gate structures 1008 surround at least a top surface and a pair of sidewalls of the three-dimensional body.

Substrate 1002 may be composed of a semiconductor material that can withstand a manufacturing process and in which charge can migrate. In an embodiment, substrate 1002 is a bulk substrate composed of a crystalline silicon, silicon/germanium or germanium layer doped with a charge carrier, such as but not limited to phosphorus, arsenic, boron or a combination thereof, to form active region 1004. In one embodiment, the concentration of silicon atoms in bulk substrate 1002 is greater than 97%. In another embodiment, bulk substrate 1002 is composed of an epitaxial layer grown atop a distinct crystalline substrate, e.g. a silicon epitaxial layer grown atop a boron-doped bulk silicon mono-crystalline substrate. Bulk substrate 1002 may alternatively be composed of a group III-V material. In an embodiment, bulk substrate 1002 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 1002 is composed of a III-V material and the charge-carrier dopant impurity atoms are ones such as, but not limited to, carbon, silicon, germanium, oxygen, sulfur, selenium or tellurium.

Isolation region 1006 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the isolation region 806 is composed of a dielectric material such as, but not limited to, silicon dioxide, silicon oxy-nitride, silicon nitride, or carbon-doped silicon nitride.

Self-aligned gate endcap isolation structures 1020 and 1021 may be composed of a material or materials suitable to ultimately electrically isolate, or contribute to the isolation of, portions of permanent gate structures from one another. Exemplary materials or material combinations include a single material structure such as silicon dioxide, silicon oxy-nitride, silicon nitride, or carbon-doped silicon nitride. Other exemplary materials or material combinations include a multi-layer stack having lower portion silicon dioxide, silicon oxy-nitride, silicon nitride, or carbon-doped silicon nitride and an upper portion higher dielectric constant material such as hafnium oxide.

Gate structures 1008 may be composed of a gate electrode stack which includes a gate dielectric layer 1052 and gate electrode layers 1050/1054. In an embodiment, the gate electrode of the gate electrode stack is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate 1002. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In an embodiment, the top high-k portion consists of a "U"-shaped structure that includes a bottom portion substantially parallel to the surface of the substrate and two sidewall portions that are substantially perpendicular to the top surface of the substrate.

In one embodiment, the gate electrode is composed of one or more metal layers such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Gate contact 814, overlying gate contact via 816, and overlying metal interconnect 860 and metal fuse contacts (anode/cathode) 830 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material). A common example is the use of copper structures that may or may not include barrier layers (such as Ta or TaN layers) between the copper and surrounding ILD material. As used herein, the term metal includes alloys, stacks, and other combinations of multiple metals. For example, the metal interconnect lines may include barrier layers, stacks of different metals or alloys, etc.

In an embodiment (although not shown), providing structure 1000 involves formation of a contact pattern which is essentially perfectly aligned to an existing gate pattern while eliminating the use of a lithographic step with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate structures 1008 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure 1000. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Referring again to FIG. 10A, in an embodiment, an integrated circuit structure has contact structures that contact portions of a gate electrode formed over an active region. In general, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for integrated circuit structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

It is to be appreciated that, as exemplified in FIGS. 10A and 10B, SAGE walls of varying width may be fabricated, e.g., relatively narrow SAGE walls 1020 and relatively wide SAGE walls 1021. It is also to be appreciated that fabrication of gate endcap isolation structures may lead to formation of a seam within the gate endcap isolation structures. It is also to be appreciated that gate endcap isolation structures may differ depending on the spacing of adjacent fins. As an example covering both aspects, FIGS. 11A-11C illustrate cross-sectional views of process operations of significance in another self-aligned gate endcap process fabrication scheme for finFET or tri-gate devices, in accordance with an embodiment of the present disclosure.

Figure 11A:
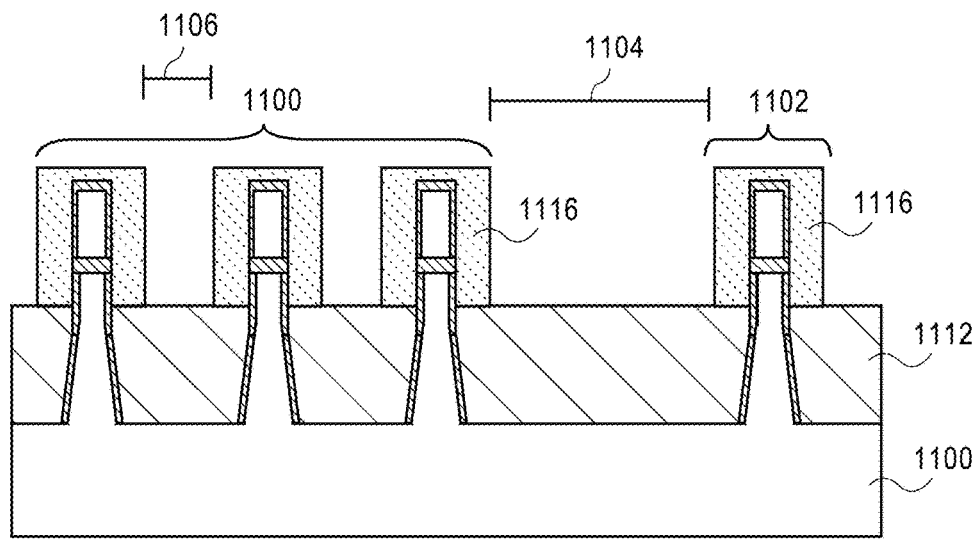
FIGS. 11A-11C illustrate cross-sectional views of process operations of significance in another self-aligned gate endcap process fabrication scheme for finFET or tri-gate devices, in accordance with an embodiment of the present disclosure.

Referring to FIG. 11A, a grouping of fins 1100 has a spacing 1106. The grouping of fins 1100 is adjacent to a fin 1102 by a larger spacing 1104. Sacrificial spacers 1116 are formed adjacent to sidewalls of the upper portions of each of plurality of semiconductor fins 1100 and 1102.

Figure 11B:
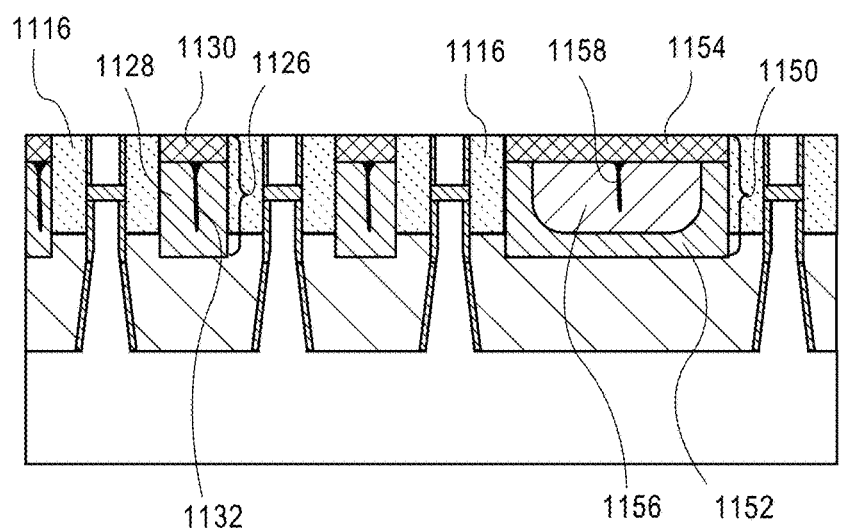
Figure 11C:
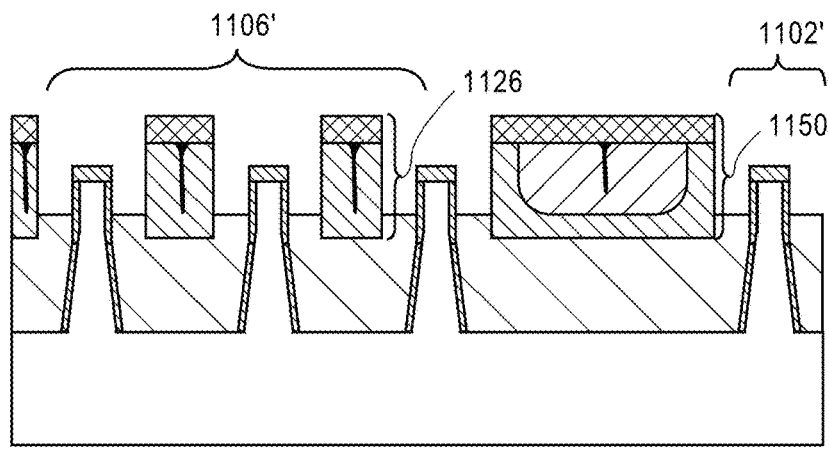

Referring to FIG. 11B, a plurality of gate endcap isolation structures 1126 and 1150 is formed between the sacrificial spacers 1116. In an embodiment, as depicted, each of the plurality of gate endcap isolation structures 1126 formed between spacings 1106 includes a lower dielectric portion 1128 and a dielectric cap 1130 on the lower dielectric portion 1128. In an embodiment, the plurality of gate endcap isolation structures 1126 is formed by depositing and then recessing a first dielectric material, such as a silicon nitride layer, to provide the lower dielectric portions 1128. The deposition process may be a conformal process which, in one embodiment, provides seams 1132 within the lower dielectric portion 1128. Thus, in an embodiment, each of the plurality of gate endcap isolation structures 1126 includes a vertical seam 1132 centered within the gate endcap isolation structure 1126. A dielectric cap material, such as a metal oxide material (e.g., hafnium oxide) is then formed in recessed regions above the lower dielectric portions 1128. The dielectric cap material may be planarized to form the dielectric cap 1130 or may be grown upward to provide the dielectric cap 1130 directly.

Referring again to FIG. 11B, in an embodiment, a gate endcap isolation structure 1126 is between semiconductor fins having a spacing 1106 and a gate endcap isolation structure 1150 is between semiconductor fins having a spacing 1104. The gate endcap isolation structure 1126 has a width narrower than a corresponding width of gate endcap isolation structure 1150. In one embodiment, the gate endcap isolation structure 1126 has a total composition different than a total composition of the gate endcap isolation structure 1150. In one such embodiment, gate endcap isolation structure 1150 further includes a third dielectric layer 1156, such as a layer of silicon oxide on a bottom portion of and within sidewalls of a lower dielectric portion 1152. A dielectric cap 1152 is further on the third dielectric layer 1156. In an embodiment, the sidewalls of the lower dielectric portion 1152 have an uppermost surface approximately co-planar with an uppermost surface of the third dielectric layer 1156, and the dielectric cap 1152 has a substantially planar bottommost surface, as is depicted in FIG. 11B. In another embodiment, the sidewalls of the lower dielectric portion 1152 have an uppermost surface below an uppermost surface of the third dielectric layer 1156, and the dielectric cap 1152 extends further down over the sidewall locations. In yet another embodiment, the sidewalls of the lower dielectric portion 1152 have an uppermost surface above an uppermost surface of the third dielectric layer 1156, and the dielectric cap 1152 extends further down over the third dielectric layer 1156.

In an embodiment, the deposition process of layer 1156 is a conformal process which, in one embodiment, provides vertical seams 1158 within the third dielectric layer 1156. However, in another embodiment, a seam 1158 is not formed in wider structures but is formed in narrower structures (e.g., seam 1132 described above). It is to be appreciated that layers 1128 and 1152 may be composed of a same material, such as silicon nitride, and formed at a same time as one another. It is also to be appreciated that layers 1130 and 1154 may be composed of a same material, such as hafnium oxide, and formed at a same time as one another. The third dielectric layer 1156 in structure 1150 but omitted from structure 1126 may be formed by conformal deposition across the entire structure but is excluded from structures 1126 since the layer 1128 essentially fills the spacing 1106 in a first deposition process which does not entirely fill the spacing 1104.

Referring to FIG. 11C, the sacrificial spacers 1116 are removed. In an embodiment, the sacrificial spacers 1116 are removed by a wet etch or dry etch process. In an embodiment, patterning stack layers above the fins are also removed to provide fins 1106' and 1102'. Thus, in an embodiment, a gate endcap isolation structure includes a vertical seam within the gate endcap isolation structure. In an embodiment, gate endcap isolation structures differ in width and/or composition depending on the spacing of adjacent fins. In accordance with an embodiment of the present disclosure, one or more of the SAGE walls 1126 or 1150 is not reduced in height in certain locations in order to retain a gate endcap plug or a contact endcap plug, while one or more of the SAGE walls 1126 or 1150 is reduced in height in certain other locations to allow for gate or contact continuity over the SAGE wall.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials, capping layers, or plugs are composed of dielectric materials different from the interlayer dielectric material. In one embodiment, different hardmask, capping or plug materials may be used in different regions so as to provide different growth or etch selectivity to each other and to the underlying dielectric and metal layers. In some embodiments, a hardmask layer, capping or plug layer includes a layer of a nitride of silicon (e.g., silicon nitride) or a layer of an oxide of silicon, or both, or a combination thereof. Other suitable materials may include carbon-based materials. Other hardmask, capping or plug layers known in the arts may be used depending upon the particular implementation. The hardmask, capping or plug layers maybe formed by CVD, PVD, or by other deposition methods.

In an embodiment, as is also used throughout the present description, lithographic operations are performed using 193 nm immersion litho (i193), EUV and/or EBDW lithography, or the like. A positive tone or a negative tone resist may be used. In one embodiment, a lithographic mask is a trilayer mask composed of a topographic masking portion, an antireflective coating (ARC) layer, and a photoresist layer. In a particular such embodiment, the topographic masking portion is a carbon hardmask (CHM) layer and the antireflective coating layer is a silicon ARC layer.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 12:
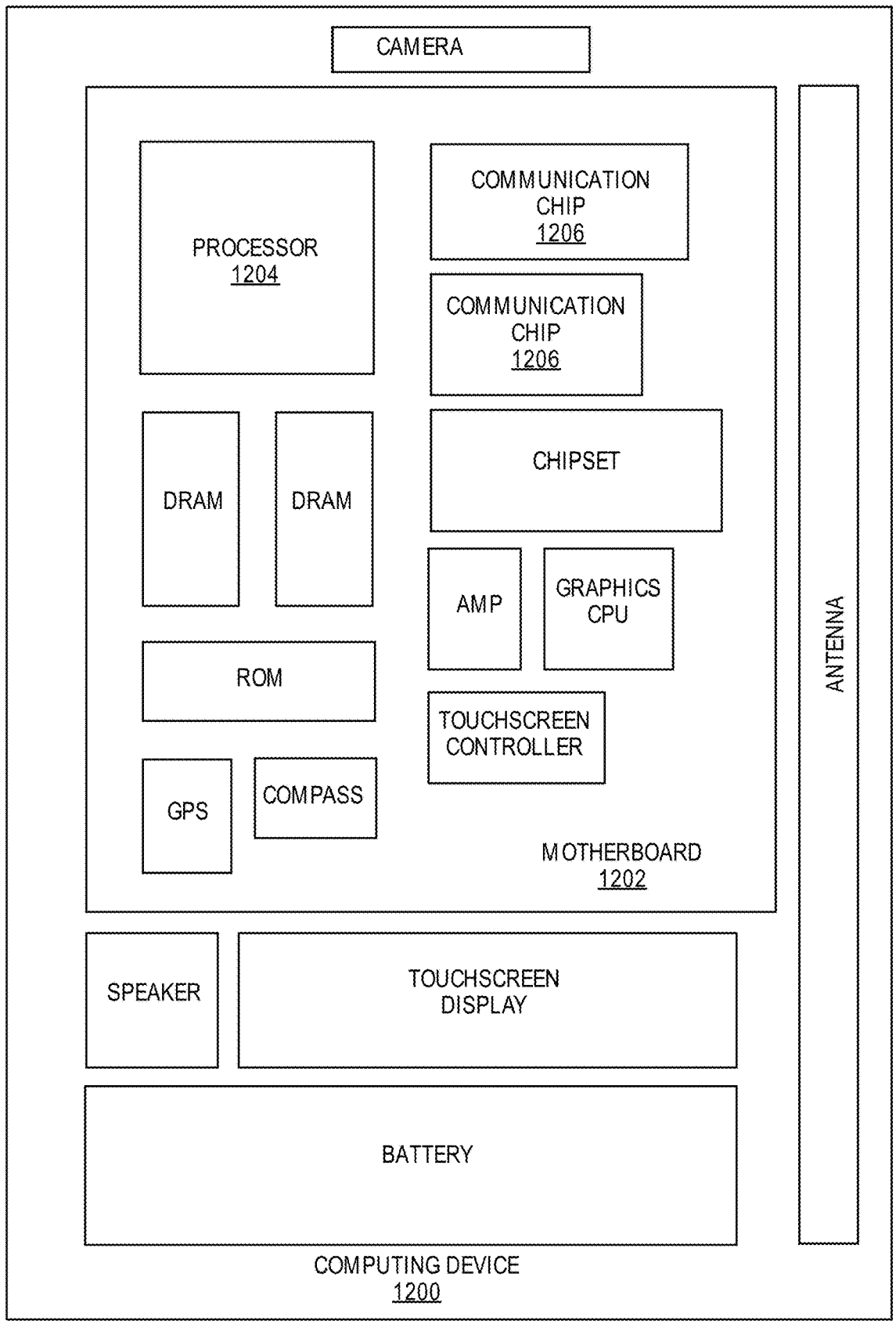
FIG. 12 illustrates a computing device in accordance with one implementation of an embodiment of the present disclosure.

FIG. 12 illustrates a computing device 1200 in accordance with one implementation of an embodiment of the present disclosure. The computing device 1200 houses a board 1202. The board 1202 may include a number of components, including but not limited to a processor 1204 and at least one communication chip 1206. The processor 1204 is physically and electrically coupled to the board 1202. In some implementations the at least one communication chip 1206 is also physically and electrically coupled to the board 1202. In further implementations, the communication chip 1206 is part of the processor 1204.

Depending on its applications, computing device 1200 may include other components that may or may not be physically and electrically coupled to the board 1202. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1206 enables wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1206 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1200 may include a plurality of communication chips 1206. For instance, a first communication chip 1206 may be dedicated to shorter range wireless communications such as Wi-Fi and Bluetooth and a second communication chip 1206 may be dedicated to longer range wireless communications such as GPS, EDGE, GPRS, CDMA, WiMAX, LTE, Ev-DO, and others.

The processor 1204 of the computing device 1200 includes an integrated circuit die packaged within the processor 1004. The integrated circuit die of the processor 1004 may include one or more structures, such as self-aligned gate endcap (SAGE)-integrated gate endcap plugs or contact endcap plugs, or both gate endcap plugs and contact endcap plugs, built in accordance with implementations of embodiments of the present disclosure. The term "processor" may refer to any device or portion of a device that processes electronic data from registers and/or memory to transform that electronic data into other electronic data that may be stored in registers and/or memory.

The communication chip 1206 also includes an integrated circuit die packaged within the communication chip 1006. The integrated circuit die of the communication chip 1006 may include one or more structures, such as self-aligned gate endcap (SAGE)-integrated gate endcap plugs or contact endcap plugs, or both gate endcap plugs and contact endcap plugs, built in accordance with implementations of embodiments of the present disclosure.

In further implementations, another component housed within the computing device 1200 may contain an integrated circuit die that includes one or structures, such as self-aligned gate endcap (SAGE)-integrated gate endcap plugs or contact endcap plugs, or both gate endcap plugs and contact endcap plugs, built in accordance with implementations of embodiments of the present disclosure.

In various implementations, the computing device 1200 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1200 may be any other electronic device that processes data.

Figure 13:
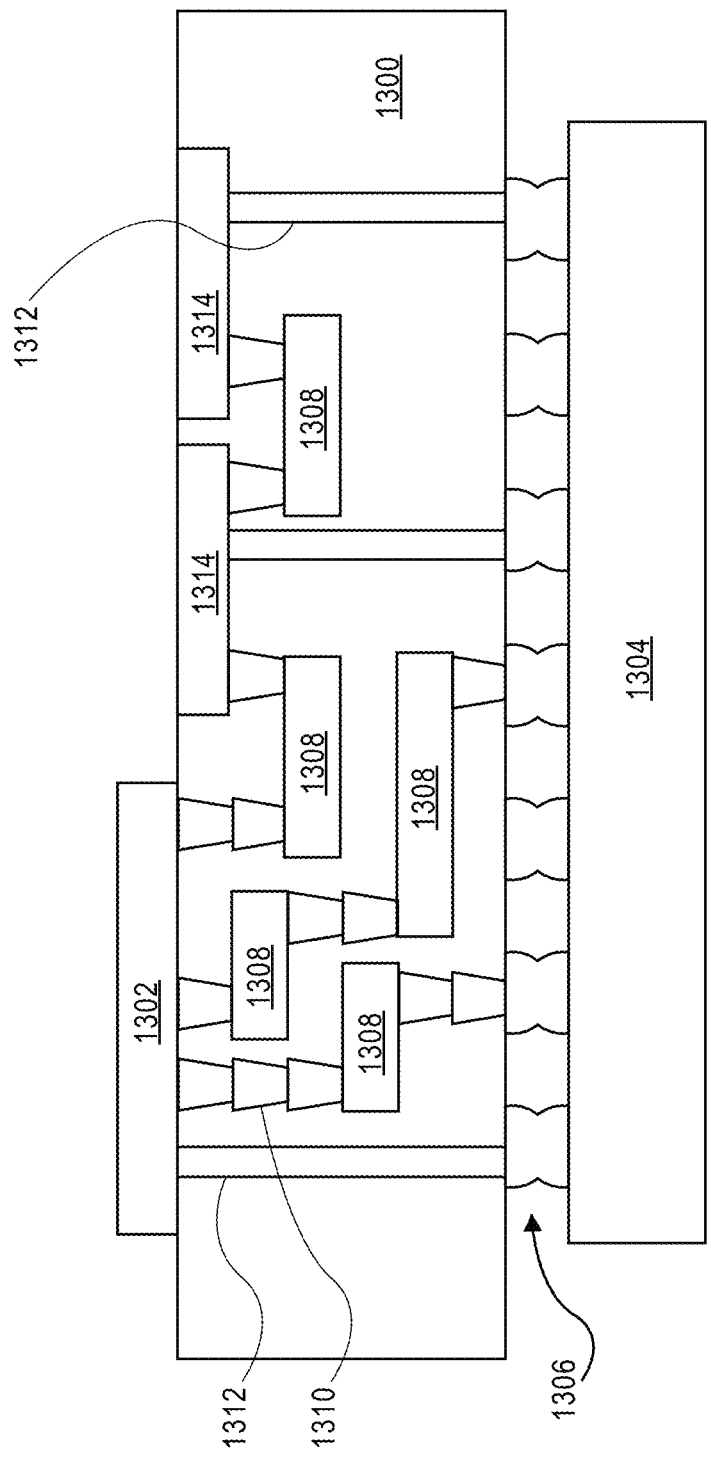
FIG. 13 illustrates an interposer that includes one or more embodiments of the present disclosure.

FIG. 13 illustrates an interposer 1300 that includes one or more embodiments of the present disclosure. The interposer 1300 is an intervening substrate used to bridge a first substrate 1302 to a second substrate 1304. The first substrate 1302 may be, for instance, an integrated circuit die. The second substrate 1304 may be, for instance, a memory module, a computer motherboard, or another integrated circuit die. Generally, the purpose of an interposer 1300 is to spread a connection to a wider pitch or to reroute a connection to a different connection. For example, an interposer 1300 may couple an integrated circuit die to a ball grid array (BGA) 1306 that can subsequently be coupled to the second substrate 1304. In some embodiments, the first and second substrates 1302/1304 are attached to opposing sides of the interposer 1300. In other embodiments, the first and second substrates 1302/1304 are attached to the same side of the interposer 1300. And in further embodiments, three or more substrates are interconnected by way of the interposer 1300.

The interposer 1300 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1308 and vias 1310, including but not limited to through-silicon vias (TSVs) 1312. The interposer 1300 may further include embedded devices 1314, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1300. In accordance with embodiments of the disclosure, apparatuses or processes disclosed herein may be used in the fabrication of interposer 1300 or in the fabrication of components included in the interposer 1300.

Thus, embodiments of the present disclosure include self-aligned gate endcap (SAGE) architectures having gate endcap plugs or contact endcap plugs, or both gate endcap plugs and contact endcap plugs, and methods of fabricating SAGE architectures having such endcap plugs.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example Embodiment 1

An integrated circuit structure includes a plurality of semiconductor fins protruding through a trench isolation region above a substrate. A first gate structure is over a first of the plurality of semiconductor fins. A second gate structure is over a second of the plurality of semiconductor fins. A first gate endcap isolation structure is laterally between and in contact with the first gate structure and the second gate structure. The first gate endcap isolation structure is on the trench isolation region and has an uppermost surface co-planar with an uppermost surface of the first gate structure and the second gate structure. A second gate endcap isolation structure is laterally between and in contact with first and second lateral portions of the first gate structure. The second gate endcap isolation structure is on the trench isolation region and has an uppermost surface below an uppermost surface of the first gate structure. A portion of the first gate structure is on the uppermost surface of the second gate endcap isolation structure.

Example Embodiment 2

The integrated circuit structure of example embodiment 1, wherein one or both of the first gate endcap isolation structure and the second gate endcap isolation structure includes an upper dielectric layer on a lower dielectric layer, the upper dielectric layer having a greater dielectric constant than the lower dielectric layer.

Example Embodiment 3

The integrated circuit structure of example embodiment 1 or 2, wherein one or both of the first gate endcap isolation structure and the second gate endcap isolation structure includes a centered vertical seam.

Example Embodiment 4

The integrated circuit structure of example embodiment 1, 2 or 3, wherein the first gate endcap isolation structure is wider than the second gate endcap isolation structure.

Example Embodiment 5

The integrated circuit structure of example embodiment 1, 2 or 3, wherein the second gate endcap isolation structure is wider than the first gate endcap isolation structure.

Example Embodiment 6

The integrated circuit structure of example embodiment 1, 2, 3, 4 or 5, wherein the uppermost surface of the first gate endcap isolation structure is co-planar with an uppermost surface of a dielectric cap of each of the first gate structure and the second gate structure.

Example Embodiment 7

An integrated circuit structure includes a plurality of semiconductor fins protruding through a trench isolation region above a substrate. A first source or drain contact structure is over a first of the plurality of semiconductor fins. A second source or drain contact structure is over a second of the plurality of semiconductor fins. A first gate endcap isolation structure is laterally between and in contact with the first source or drain contact structure and the second source or drain contact structure. The first gate endcap isolation structure is on the trench isolation region and has an uppermost surface co-planar with an uppermost surface of the first source or drain contact structure and the second source or drain contact structure. A second gate endcap isolation structure is laterally between and in contact with first and second lateral portions of the first source or drain contact structure. The second gate endcap isolation structure is on the trench isolation region and has an uppermost surface below an uppermost surface of the first source or drain contact structure. A portion of the first source or drain contact structure is on the uppermost surface of the second gate endcap isolation structure.

Example Embodiment 8

The integrated circuit structure of example embodiment 7, wherein one or both of the first gate endcap isolation structure and the second gate endcap isolation structure includes an upper dielectric layer on a lower dielectric layer, the upper dielectric layer having a greater dielectric constant than the lower dielectric layer.

Example Embodiment 9

The integrated circuit structure of example embodiment 7 or 8, wherein one or both of the first gate endcap isolation structure and the second gate endcap isolation structure includes a centered vertical seam.

Example Embodiment 10

The integrated circuit structure of example embodiment 7, 8 or 9, wherein the first gate endcap isolation structure is wider than the second gate endcap isolation structure.

Example Embodiment 11

The integrated circuit structure of example embodiment 7, 8 or 9, wherein the second gate endcap isolation structure is wider than the first gate endcap isolation structure.

Example Embodiment 12

The integrated circuit structure of example embodiment 7, 8, 9, 10 or 11, wherein the uppermost surface of the first gate endcap isolation structure is co-planar with a conductive surface of each of the first source or drain contact structure and the second source or drain contact structure.

Example Embodiment 13

An integrated circuit structure includes a plurality of semiconductor fins protruding through a trench isolation region above a substrate. A first gate structure is over a first of the plurality of semiconductor fins. A second gate structure is over the first of the plurality of semiconductor fins. A gate endcap isolation structure is in contact with the first gate structure and the second gate structure. The gate endcap isolation structure is on the trench isolation region and has a first upper surface co-planar with an uppermost surface of the first gate structure. The gate endcap isolation structure has a second upper surface below the first upper surface. A portion of the second gate structure is on the second upper surface of the gate endcap isolation structure.

Example Embodiment 14

The integrated circuit structure of example embodiment 13, wherein the gate endcap isolation structure includes an upper dielectric layer on a lower dielectric layer, the upper dielectric layer having a greater dielectric constant than the lower dielectric layer.

Example Embodiment 15

The integrated circuit structure of example embodiment 13 or 14, wherein the gate endcap isolation structure includes a centered vertical seam.

Example Embodiment 16

The integrated circuit structure of example embodiment 13, 14 or 15, wherein the first upper surface of the gate endcap isolation structure is co-planar with an uppermost surface of a dielectric cap of the first gate structure.

Example Embodiment 17

An integrated circuit structure includes a plurality of semiconductor fins protruding through a trench isolation region above a substrate. A first source or drain contact structure is over a first of the plurality of semiconductor fins. A second source or drain contact structure is over the first of the plurality of semiconductor fins. A gate endcap isolation structure is in contact with the first source or drain contact structure and the second source or drain contact structure. The gate endcap isolation structure is on the trench isolation region and has a first upper surface co-planar with an uppermost surface of the first source or drain contact structure. The gate endcap isolation structure has a second upper surface below the first upper surface. A portion of the second source or drain contact structure is on the second upper surface of the gate endcap isolation structure.

Example Embodiment 18

The integrated circuit structure of example embodiment 17, wherein the gate endcap isolation structure includes an upper dielectric layer on a lower dielectric layer, the upper dielectric layer having a greater dielectric constant than the lower dielectric layer.

Example Embodiment 19

The integrated circuit structure of example embodiment 17 or 18, wherein the gate endcap isolation structure includes a centered vertical seam.

Example Embodiment 20

The integrated circuit structure of example embodiment 17, 18 or 19, wherein the first upper surface of the gate endcap isolation structure is co-planar with a conductive surface of the first source or drain contact structure.

What is claimed is:
1. An integrated circuit structure, comprising:
   a plurality of semiconductor fins protruding through a trench isolation region above a substrate;
   a first gate structure over a first of the plurality of semiconductor fins;
   a second gate structure over a second of the plurality of semiconductor fins;
   a first gate endcap isolation structure laterally between and in contact with the first gate structure and the second gate structure, the first gate endcap isolation structure on the trench isolation region and having an uppermost surface co-planar with an uppermost surface of the first gate structure and the second gate structure; and a second gate endcap isolation structure laterally between and in contact with first and second lateral portions of the first gate structure, the second gate endcap isolation structure on the trench isolation region and having an uppermost surface below an uppermost surface of the first gate structure, a portion of the first gate structure on the uppermost surface of the second gate endcap isolation structure.

2. The integrated circuit structure of claim 1, wherein one or both of the first gate endcap isolation structure and the second gate endcap isolation structure comprises an upper dielectric layer on a lower dielectric layer, the upper dielectric layer having a greater dielectric constant than the lower dielectric layer.

3. The integrated circuit structure of claim 1, wherein one or both of the first gate endcap isolation structure and the second gate endcap isolation structure comprises a centered vertical seam.

4. The integrated circuit structure of claim 1, wherein the first gate endcap isolation structure is wider than the second gate endcap isolation structure.

5. The integrated circuit structure of claim 1, wherein the second gate endcap isolation structure is wider than the first gate endcap isolation structure.

6. The integrated circuit structure of claim 1, wherein the uppermost surface of the first gate endcap isolation structure is co-planar with an uppermost surface of a dielectric cap of each of the first gate structure and the second gate structure.

7. An integrated circuit structure, comprising:
a plurality of semiconductor fins protruding through a trench isolation region above a substrate;
a first source or drain contact structure over a first of the plurality of semiconductor fins; a second source or drain contact structure over a second of the plurality of semiconductor fins;
a first gate endcap isolation structure laterally between and in contact with the first source or drain contact structure and the second source or drain contact structure, the first gate endcap isolation structure on the trench isolation region and having an uppermost surface co-planar with an uppermost surface of the first source or drain contact structure and the second source or drain contact structure; and
a second gate endcap isolation structure laterally between and in contact with first and second lateral portions of the first source or drain contact structure, the second gate endcap isolation structure on the trench isolation region and having an uppermost surface below an uppermost surface of the first source or drain contact structure, a portion of the first source or drain contact structure on the uppermost surface of the second gate endcap isolation structure.

8. The integrated circuit structure of claim 7, wherein one or both of the first gate endcap isolation structure and the second gate endcap isolation structure comprises an upper dielectric layer on a lower dielectric layer, the upper dielectric layer having a greater dielectric constant than the lower dielectric layer.

9. The integrated circuit structure of claim 7, wherein one or both of the first gate endcap isolation structure and the second gate endcap isolation structure comprises a centered vertical seam.

10. The integrated circuit structure of claim 7, wherein the first gate endcap isolation structure is wider than the second gate endcap isolation structure.

11. The integrated circuit structure of claim 7, wherein the second gate endcap isolation structure is wider than the first gate endcap isolation structure.

12. The integrated circuit structure of claim 7, wherein the uppermost surface of the first gate endcap isolation structure is co-planar with a conductive surface of each of the first source or drain contact structure and the second source or drain contact structure.

13. An integrated circuit structure, comprising:
a plurality of semiconductor fins protruding through a trench isolation region above a substrate; a first gate structure over a first of the plurality of semiconductor fins;
a second gate structure over the first of the plurality of semiconductor fins; and
a gate endcap isolation structure in contact with the first gate structure and the second gate structure, the gate endcap isolation structure on the trench isolation region and having a first upper surface co-planar with an uppermost surface of the first gate structure, and the gate endcap isolation structure having a second upper surface below the first upper surface, a portion of the second gate structure on the second upper surface of the gate endcap isolation structure.

14. The integrated circuit structure of claim 13, wherein the gate endcap isolation structure comprises an upper dielectric layer on a lower dielectric layer, the upper dielectric layer having a greater dielectric constant than the lower dielectric layer.

15. The integrated circuit structure of claim 13, wherein the gate endcap isolation structure comprises a centered vertical seam.

16. The integrated circuit structure of claim 13, wherein the first upper surface of the gate endcap isolation structure is co-planar with an uppermost surface of a dielectric cap of the first gate structure.

17. An integrated circuit structure, comprising:
a plurality of semiconductor fins protruding through a trench isolation region above a substrate;
a first source or drain contact structure over a first of the plurality of semiconductor fins;
a second source or drain contact structure over the first of the plurality of semiconductor fins; and
a gate endcap isolation structure in contact with the first source or drain contact structure and the second source or drain contact structure, the gate endcap isolation structure on the trench isolation region and having a first upper surface co-planar with an uppermost surface of the first source or drain contact structure, and the gate endcap isolation structure having a recess, the recess having a second upper surface below the first upper surface, a portion of the second source or drain contact structure on the second upper surface of the recess of the gate endcap isolation structure.

18. The integrated circuit structure of claim 17, wherein the gate endcap isolation structure comprises an upper dielectric layer on a lower dielectric layer, the upper dielectric layer having a greater dielectric constant than the lower dielectric layer.

19. The integrated circuit structure of claim 17, wherein the gate endcap isolation structure comprises a centered vertical seam.

20. The integrated circuit structure of claim 17, wherein the first upper surface of the gate endcap isolation structure is co-planar with a conductive surface of the first source or drain contact structure.

* * * * *